(12) United States Patent
Nishimura

(10) Patent No.: US 11,322,582 B2
(45) Date of Patent: May 3, 2022

(54) SEMICONDUCTOR DEVICE

(71) Applicant: FUJI ELECTRIC CO., LTD., Kawasaki (JP)

(72) Inventor: Takeyoshi Nishimura, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/984,112

(22) Filed: Aug. 3, 2020

(65) Prior Publication Data

US 2021/0074808 A1 Mar. 11, 2021

(30) Foreign Application Priority Data

Sep. 10, 2019 (JP) .............................. JP2019-164820

(51) Int. Cl.
*H01L 29/06* (2006.01)
*H01L 27/088* (2006.01)
*H01L 29/78* (2006.01)

(52) U.S. Cl.
CPC ........ *H01L 29/0634* (2013.01); *H01L 27/088* (2013.01); *H01L 29/0696* (2013.01); *H01L 29/7813* (2013.01)

(58) Field of Classification Search
CPC ............... H01L 29/0634; H01L 27/088; H01L 29/0696; H01L 29/7813; H01L 29/0615; H01L 29/0619; H01L 29/0878; H01L 29/66734; H01L 29/7811; H01L 29/0684; H01L 29/4236; H01L 29/42352; H01L 29/66613–66628; H01L 29/42356
See application file for complete search history.

(56) References Cited

U.S. PATENT DOCUMENTS

| | | | |
|---|---|---|---|
| 7,737,469 B2 * | 6/2010 | Saito | .................... H01L 29/7395 257/197 |
| 2014/0374819 A1 | 12/2014 | Niimura et al. | |
| 2017/0047321 A1 | 2/2017 | Nishimura | |
| 2017/0229356 A1 | 8/2017 | Niimura et al. | |

FOREIGN PATENT DOCUMENTS

| | | | |
|---|---|---|---|
| JP | 2004022716 | A | 1/2004 |
| JP | 2017037997 | A | 2/2017 |
| JP | 2017143234 | A | 8/2017 |
| JP | 6207676 | B2 | 10/2017 |
| WO | 2014013888 | A1 | 1/2014 |

* cited by examiner

*Primary Examiner* — Cuong B Nguyen
(74) *Attorney, Agent, or Firm* — Rabin & Berdo, P.C.

(57) ABSTRACT

A semiconductor device, including a parallel pn layer formed on a semiconductor substrate, and an insulated gate structure provided on the parallel pn layer. The parallel pn layer includes a plurality of first regions and a plurality of second regions disposed repeatedly alternating one another along a first direction that is parallel to an upper surface of the semiconductor substrate. Each of the first regions and second regions has, along the first direction, an impurity concentration that has a maximum value thereof at a peak position and that decreases gradually from the peak position. Each of the first regions and second regions has, along a depth direction thereof, a first part and a second part, a gradient of the impurity concentration along the first direction being respectively symmetrical and asymmetrical in the first part and in the second part, with respect to the peak position.

8 Claims, 15 Drawing Sheets

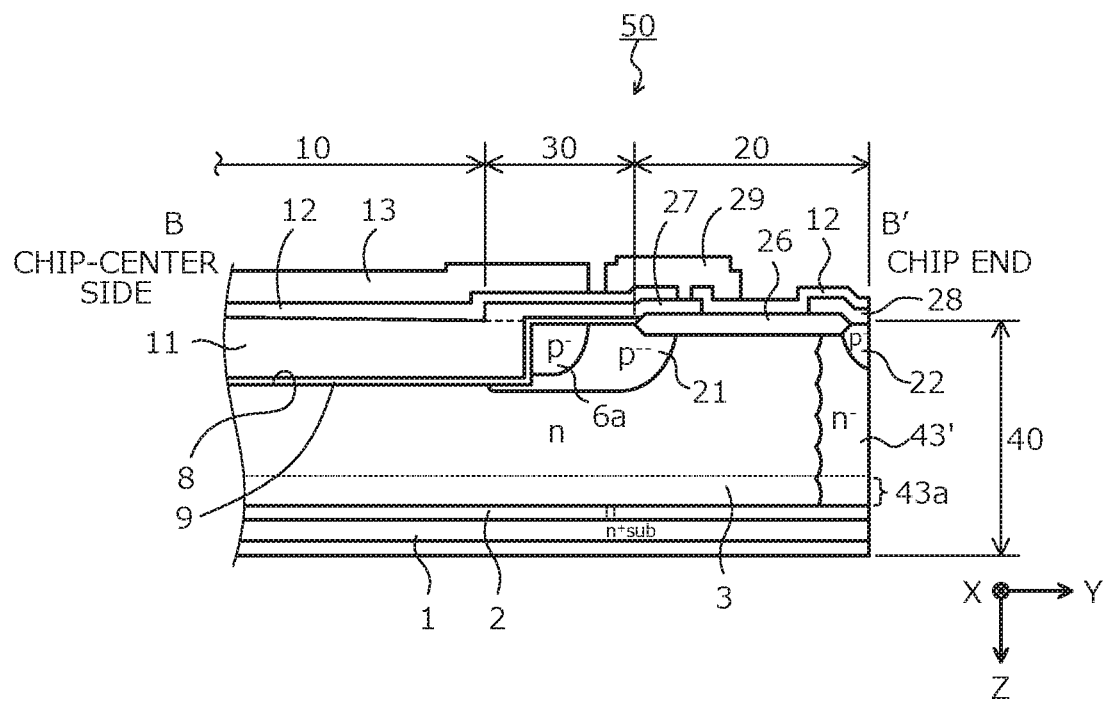
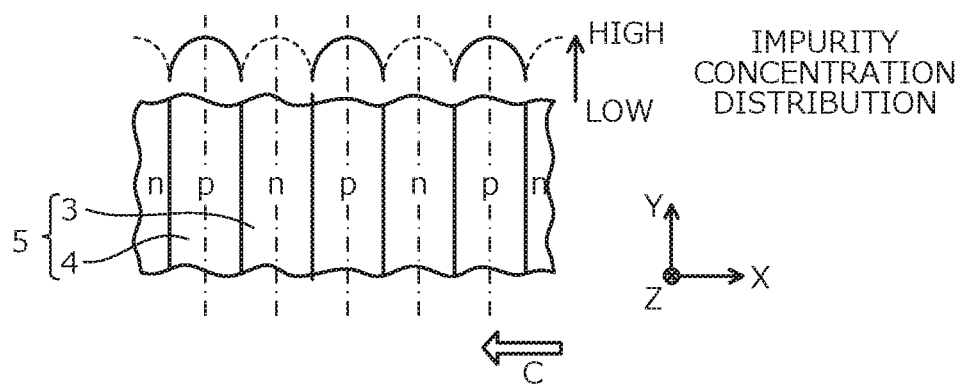

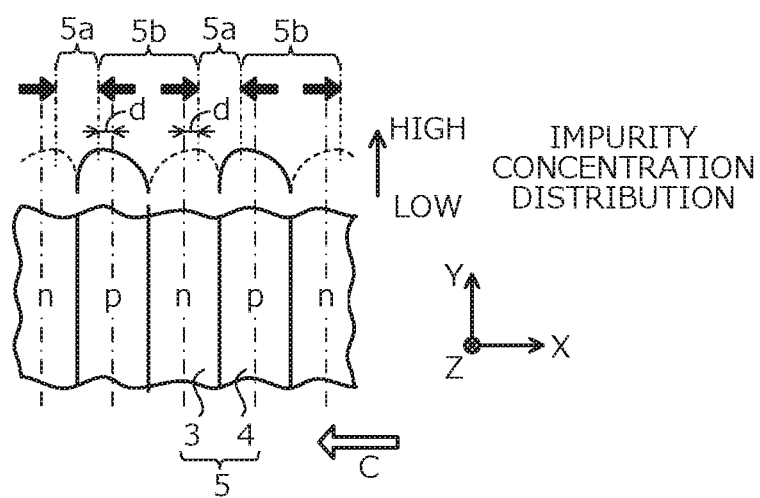

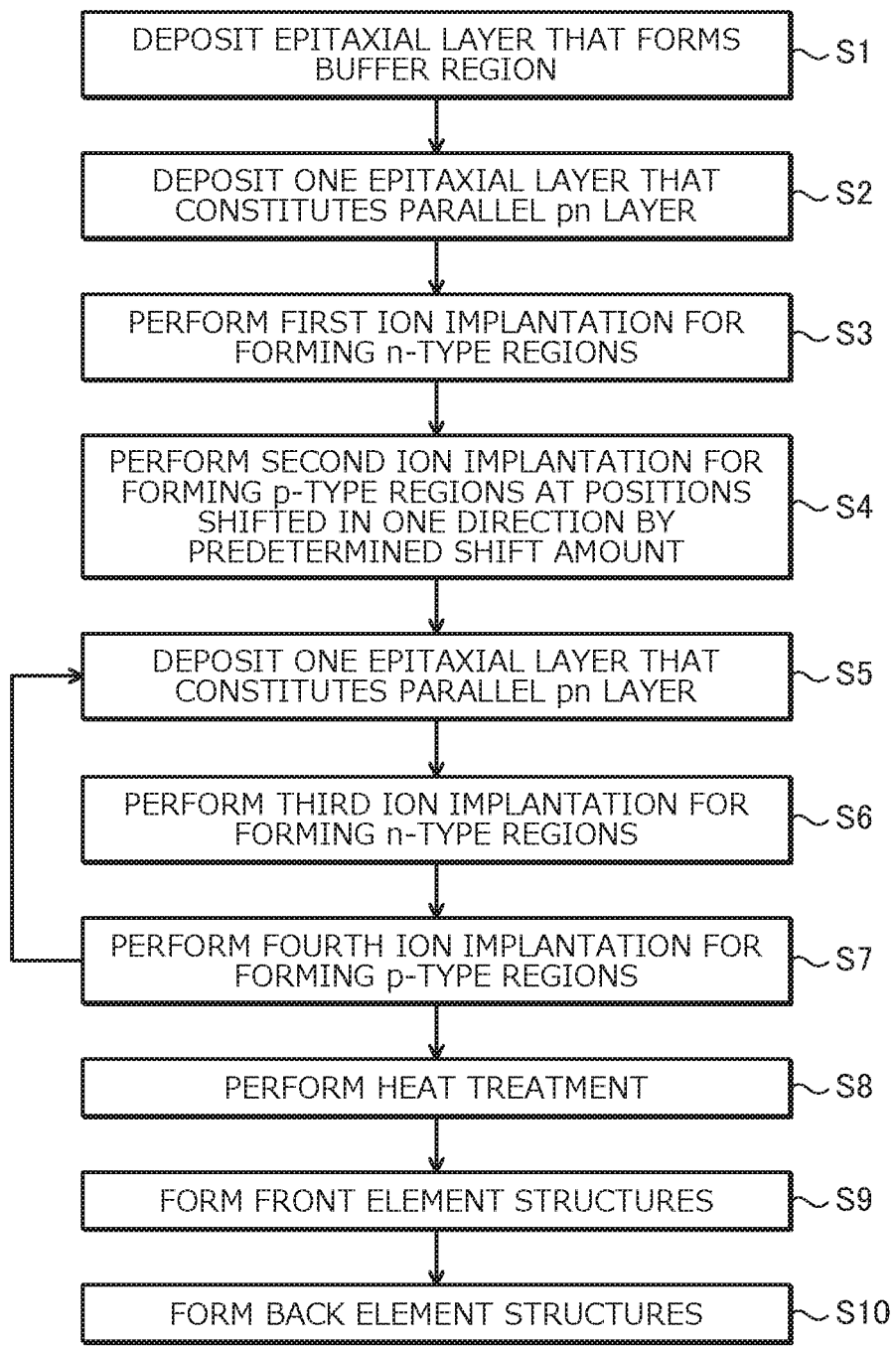

SEMICONDUCTOR DEVICE

CROSS REFERENCE TO RELATED APPLICATIONS

This application is based upon and claims the benefit of priority of the prior Japanese Patent Application No. 2019-164820, filed on Sep. 10, 2019, the entire contents of which are incorporated herein by reference.

BACKGROUND OF THE INVENTION

1. Field of the Invention

Embodiments of the invention relate to a semiconductor device.

2. Description of the Related Art

Conventionally, a super junction (SJ) semiconductor device having, as a drift layer, a parallel pn layer in which n-type regions and p-type regions are disposed to be adjacent and repeatedly alternate each other in a direction (horizontal direction) parallel to a main surface of a semiconductor substrate (semiconductor chip) is commonly known. As a method of forming the parallel pn layer of a super junction semiconductor device, a multi-stage epitaxial method is known in which, as a parallel pn layer, n-type regions and p-type regions are formed in epitaxial layers stacked in multiple stages to form a drift layer, so that regions of the same conductivity are adjacent and face each other in a depth direction (vertical direction).

A structure of a conventional super junction semiconductor device will be described taking a super junction metal oxide semiconductor field effect transistor (MOSFET) as an example. FIG. 20 is a plan view depicting a layout of a parallel pn layer of the conventional super junction semiconductor device as viewed from a front side of a semiconductor substrate. FIG. 21 is a cross-sectional view of the structure along cutting line AA-AA' in FIG. 20. FIG. 21 depicts a cross-sectional view of the structure of a parallel pn layer 105 of an active region 110.

A conventional super junction semiconductor device 150 depicted in FIGS. 20 and 21 is a super junction MOSFET having as a drift layer in an active region 110, the parallel pn layer 105 in which n-type regions 103 and p-type regions 104 are disposed adjacently to each other and repeatedly alternate each other in a first direction X that is parallel to a main surface of a semiconductor substrate 140. The n-type regions 103 and the p-type regions 104 each has a shape of a stripe extending in a second direction Y that is parallel to the main surface of the semiconductor substrate 140 and orthogonal to the first direction X. In an edge termination region 120, n-type regions 123 and p-type regions 124 of parallel pn layers 125 are disposed adjacently to each other, repeatedly alternate each other in the first direction X, and are structured similarly to the n-type regions 103 and the p-type regions 104, respectively, thereby forming the parallel pn layers 125.

The parallel pn layers 105, 125 are provided on a front surface of an n$^+$-type semiconductor substrate 141 constituting an n$^+$-type drain region 101, via an n-type epitaxial layer 142 that constitutes an n-type buffer region 102. The parallel pn layers 105, 125 are adjacent to each other. The n-type regions 103 and the p-type regions 104 are formed in each of the epitaxial layers (in FIG. 21, the epitaxial layers deposited in multiple stages are depicted as epitaxial layers 143 of a single layer) deposited in multiple stages and constituting the parallel pn layer 105, the n-type regions 103 and the p-type regions 104 being formed by ion implantation of an n-type impurity and a p-type impurity, respectively, so that regions of the same conductivity are adjacent to each other and face each other in a depth direction Z.

The semiconductor substrate 140 is an epitaxial substrate in which the n-type epitaxial layer 142, and the epitaxial layers 143 that are the parallel pn layers 105, 125 are sequentially deposited on a front surface of the n$^+$-type semiconductor substrate 141. At a side of the parallel pn layer 105, the side opposite that facing the n$^+$-type drain region 101, a general MOS gate including a p$^-$-type base region 106, n$^+$-type source regions 107, trenches 108, a gate insulating film 109, and gate electrodes 111 is provided. Reference numerals 112, 113, and 114 are an interlayer insulating film, a source electrode, and a drain electrode, respectively. Reference numeral 130 is an intermediate region between the active region 110 and the edge termination region 120.

In the conventional super junction semiconductor device 150, to ensure a predetermined breakdown voltage, in the parallel pn layer 105 in the active region 110, a pair of one of the n-type regions 103 and one of the p-type regions 104 adjacent thereto is charge balanced and is disposed symmetrically in a same shape and at a same position in each of the epitaxial layers 143 that are deposited in multiple stages. Charge balance indicates a ratio of charge amount represented by a mathematical product of carrier concentration (impurity concentration) of the n-type regions 103 of the parallel pn layer 105 and a width of the n-type regions 103, to a charge amount represented by a mathematical product of carrier concentration (impurity concentration) of the p-type regions 104 and a width of the p-type regions 104. In an OFF state, a depletion layer spreads to the parallel pn layer 105, from pn junctions between the p-type regions 104 and the n-type regions 103 adjacent thereto, whereby the breakdown voltage is burdened and a breakdown voltage that exceeds the breakdown voltage that is actually possible by the impurity concentration of the drift layer is ensured. Increasing the impurity concentration of the drift layer enables significant reduction of ON resistance.

As for a conventional super junction semiconductor device, a device that includes in an active region, a parallel pn layer that is charge balanced with respect to n-type regions and p-type regions has been proposed, where a field plate disposed in a ring-shape surrounding a periphery of the active region is not in contact (electrical contact) with a p-type RESURF region, at chip corner parts (for example, refer to Japanese Patent No. 6207676). In Japanese Patent No. 6207676, at the chip corner parts where distribution of equipotential surfaces is curved, the field plate and the p-type RESURF region are not in contact with each other, whereby between the chip corner parts, electric potential at chip linear parts where the distribution of equipotential surfaces is relatively flat is supplied to the chip corner parts through the field plate.

As for another conventional super junction semiconductor device, a device has been proposed in which, spanning a temperature detection region in which a temperature detection diode is disposed and an active region surrounding a periphery of the temperature detection region, parallel pn layers that have a same structure and are charge balanced between n-type regions and p-type regions that are disposed uniformly and periodically (for example, refer to Japanese Laid-Open Patent Publication No. 2017-037997). In Japanese Laid-Open Patent Publication No. 2017-037997, on an n-type region of a parallel pn layer, a gate electrode having a same width as that of the n-type region and the temperature detection diode containing polysilicon having a same thickness and width as those of the gate electrode are disposed, whereby collapse of the charge balance between the n-type regions and the p-type regions of the parallel pn layer is suppressed.

As for another conventional super junction semiconductor device, a device has been proposed in which n-type regions and p-type regions of a parallel pn layer as well as parts closer to a drain than parts closer to a source are low impurity concentration regions and a drain-side end of drain-side part (low impurity concentration region) of the p-type regions of the parallel pn layer has a structure in which a first part having an impurity concentration higher than that of a part in contact with the low impurity concentration region and a second part having an impurity concentration lower than that of a part in contact with the low impurity concentration region are disposed at equal intervals and are adjacent to and repeatedly alternate each other in a direction in which the p-type region extends in a linear shape parallel to a front surface of a semiconductor substrate (for example, refer to International Publication No. WO2014/013888).

Further, in International Publication No. WO2014/013888, the high-impurity-concentration first part of the drain-side part of the p-type regions of the parallel pn layer have a greater width than that of a source-side part of the n-type regions and the low-impurity-concentration second part of the drain-side parts of the p-type regions of the parallel pn layer have smaller width than that of the source-side part of the n-type regions. In this manner, the drain-side ends of the drain-side part of the p-type regions of the parallel pn layer has a structure in which the first part having a high p-type concentration and being an inflow starting point of current (hereinafter, avalanche current) that flows during avalanche breakdown is selectively provided, whereby an operating area of a parasitic bipolar transistor is reduced and avalanche resistance is enhanced.

As for another conventional super junction semiconductor device, a device has been proposed in which a repeat pitch for n-type regions and p-type regions of parallel pn layers of a portion of an edge termination region is narrower than a repeat pitch for n-type regions and p-type regions of a parallel pn layer in an active region (for example, refer to Japanese Laid-Open Patent Publication No. 2004-022716). In Japanese Laid-Open Patent Publication No. 2004-022716, the repeat pitch for the n-type regions and the p-type regions of a parallel pn layer in the edge termination region is set to be narrower, thereby making the spreading of a depletion layer in the parallel pn layer of the edge termination region easier than in the parallel pn layer of the active region, whereby accumulated carriers are distributed and an occurrence of electric field concentration at the parallel pn layer of the edge termination region is suppressed, thereby enhancing reverse recovery capability.

As for a method of manufacturing a conventional super junction semiconductor device, a method has been proposed in which different first and second characteristics correlated with feedback capacitance of a semiconductor element are obtained and based on the first and the second characteristics, the feedback capacitance of the semiconductor element is evaluated to determine whether a product passes (for example, refer to Japanese Laid-Open Patent Publication No. 2017-143234). In Japanese Laid-Open Patent Publication No. 2017-143234, as the first and the second characteristics, avalanche breakdown voltage and ON resistance, which are easily measurable are obtained, respectively and based on the first and the second characteristics, variation of the obtained feedback capacitance is evaluated, whereby fluctuation (misalignment) of the widths of the n-type regions and the p-type regions of the parallel pn layer, the fluctuation causing fluctuation of the feedback capacitance is detected.

SUMMARY OF THE INVENTION

According to an embodiment of the invention, a semiconductor device includes a semiconductor substrate of a first conductivity type, the semiconductor substrate having an upper surface; a first parallel pn layer having a plurality of first first-conductivity-type regions and a plurality of first second-conductivity-type regions disposed repeatedly alternating one another along a first direction that is parallel to the upper surface of the semiconductor substrate, the first parallel pn layer being provided at the upper surface of the semiconductor substrate and having an upper surface; and an insulated gate structure provided at the upper surface of the first parallel pn layer. Each of the plurality of first first-conductivity-type regions has, along the first direction, a first impurity concentration that has a maximum value thereof at a first peak position and that decreases gradually from the first peak position, said each first first-conductivity-type region having, along a depth direction thereof, a first part that reaches a predetermined depth from the upper surface of the first parallel pn layer, and a second part that is closer to the semiconductor substrate than is the first part, a gradient of the first impurity concentration along the first direction being respectively symmetrical and asymmetrical in the first part and in the second part, with respect to the first peak position. Each of the plurality of first second-conductivity-type regions has, along the first direction, a second impurity concentration that has a maximum value thereof at a second peak position and that decreases gradually from the second peak position, said each first second-conductivity-type region including, along a depth direction thereof, a third part that reaches the predetermined depth from the upper surface of the first parallel pn layer, and a fourth part that is closer to the semiconductor substrate than is the third part, a gradient of the second impurity concentration along the first direction being respectively symmetrical and asymmetrical in the third part and in the fourth part, with respect to the second peak position.

In the embodiment, the first impurity concentration of each of the plurality of first first-conductivity-type regions has different first peak positions in the first part and in the second part along the first direction, the different first peak positions being respectively centered and off-centered with respect to the first part and the second part along the first direction. The second impurity concentration of each of the plurality of first second-conductivity-type regions has different second peak positions in the third part and in the fourth part along the first direction, the different second peak positions being respectively centered and off-centered with respect to the third part and the fourth part along the first direction.

In the embodiment, the plurality of first first-conductivity-type regions and the plurality of first second-conductivity-type regions are disposed repeatedly with a repeat pitch, and a distance between the first peak position of the first part and the first peak position of the second part along the first direction is in a range from 7% to 18% of the repeat pitch.

In the embodiment, the first impurity concentration of each of the plurality of first first-conductivity-type regions has different first peak positions in the first part and in the second part thereof along the first direction. The second impurity concentration of each of the plurality of first second-conductivity-type regions has different second peak positions in the third part and in the fourth part along the first direction. All first peak positions of the second parts of all of the plurality of first first-conductivity-type regions are off-centered in a same direction along the first direction with respect to the respective second parts. All second peak positions of the fourth parts of all of the plurality of first second-conductivity-type regions are off-centered in the same direction along the first direction with respect to the respective fourth parts.

In the embodiment, the semiconductor device further includes a second parallel pn layer having a plurality of second first-conductivity-type regions and a plurality of second second-conductivity-type regions disposed repeatedly alternating one another along the first direction at a second repeat pitch that is smaller than a first repeat pitch at which the plurality of first first-conductivity-type regions and the plurality of first second-conductivity-type regions are disposed, the second parallel pn layer surrounding a periphery of the first parallel pn layer. Each of the plurality of second first-conductivity-type regions has a third impurity concentration that has a maximum value thereof at a third peak position and that decreases gradually from the third peak position along the first direction, a gradient of the third impurity concentration along the first direction being symmetrical along the first direction with respect to the third peak position. Each of the plurality of second second-conductivity-type regions has a fourth impurity concentration that has a maximum value thereof at a fourth peak position and that decreases gradually from the fourth peak position along the first direction, a gradient of the fourth impurity concentration along the first direction being symmetrical along the first direction with respect to the fourth peak position.

In the embodiment, the semiconductor device further includes a third parallel pn layer having a plurality of third first-conductivity-type regions and a plurality of third second-conductivity-type regions disposed repeatedly alternating one another along the first direction at a third repeat pitch that is equal to the first repeat pitch, the third parallel pn layer being disposed between the first parallel pn layer and the second parallel pn layer, and surrounding a periphery of the first parallel pn layer. The plurality of third second-conductivity-type regions has an impurity concentration distribution that is the same as an impurity concentration distribution of the plurality of first second-conductivity-type regions. Only an innermost third second-conductivity-type region, of the plurality of third second-conductivity-type regions, that is disposed closest to a chip center has an impurity concentration of which a gradient is the same as the gradient of the second impurity concentration of each of the plurality of first second-conductivity-type regions.

In the embodiment, the semiconductor device further includes a semiconductor layer of the first conductivity type, provided between the semiconductor substrate and the first parallel pn layer.

In the embodiment, the semiconductor device further includes a first insulated gate field effect transistor having the insulated gate structure and the first parallel pn layer provided on the semiconductor substrate, the first insulated gate field effect transistor including a first number of unit cells; and a second insulated gate field effect transistor provided on the semiconductor substrate and having a plurality of unit cells fewer in number than the first number of unit cells of the first insulated gate field effect transistor, each of the plurality of unit cells of the second insulated gate field effect transistor having a structure that is the same as a structure of the unit cells of the first insulated gate field effect transistor.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 3 is a cross-sectional view of the structure along cutting line B-B' in FIG. 1.

FIG. 4 is a characteristics diagram depicting a plan view of the structure at cutting line C-C' in FIG. 2 and an impurity concentration distribution.

FIG. 5 is a characteristics diagram of a plan view of the structure at cutting line D-D' in FIG. 2 and an impurity concentration distribution.

FIG. 6 is a flowchart of an outline of a method of manufacturing the semiconductor device according to the first embodiment.

DETAILED DESCRIPTION OF THE INVENTION

Figure 1:
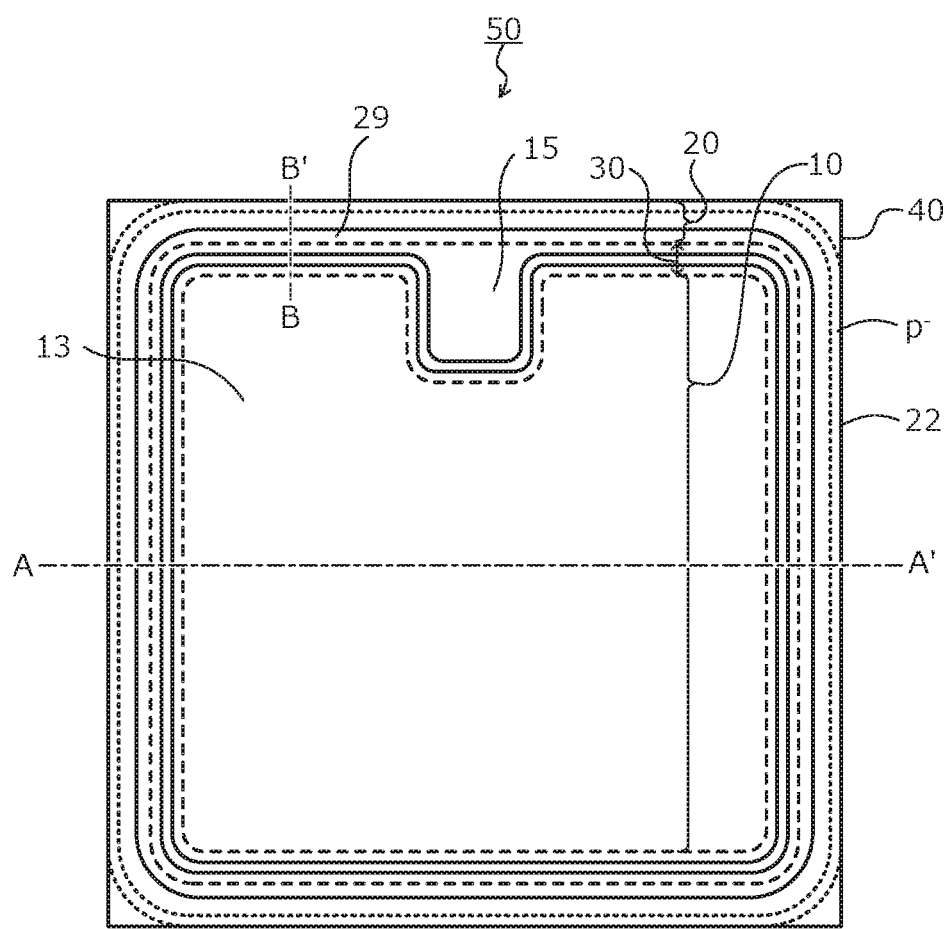
FIG. 1 is a plan view depicting a layout of a semiconductor device 50 according to a first embodiment semiconductor substrate when viewed from a front side thereof.

First, problems associated with the conventional techniques will be discussed. As described above, in a super junction semiconductor device, when a breakdown voltage that exceeds a breakdown voltage that is actually possible by the impurity concentration of the drift layer is ensured by a structure in which, during the OFF state, a depletion layer in the parallel pn layer 105 spreads from pn junctions between the p-type regions 104 and the n-type regions 103 of the parallel pn layer 105, and thus, the charge balance of the n-type regions 103 and the p-type regions 104 of the parallel pn layer 105 collapses (for example, when the ratio of the charge amount of the n-type regions 103 and the p-type regions 104 deviates from 1:1 or when the respective charge amounts of the n-type regions 103 and the p-type regions 104 disposed in the parallel pn layer 105 vary greatly, etc.), the breakdown voltage decreases. On the other hand, when the charge balance of the n-type regions 103 and the p-type regions 104 of the parallel pn layer 105 is over compensated for (for example, when the ratio of the charge amount of the n-type regions 103 and the p-type regions 104 is 1:1, etc.), the avalanche resistance significantly decreases due to minor process variations such as variations in impurity concentration and/or positioning.

Further, when the charge balance of the n-type regions 103 and the p-type regions 104 of the parallel pn layer 105 is over compensated for and avalanche breakdown occurs at a part near the p$^-$-type base region 106 of the parallel pn layer 105, avalanche current flows into the p$^-$-type base region 106 that is a base of an npn parasitic bipolar transistor, without passing a resistance component (drift resistance) of the p-type regions 104, whereby decrease of the avalanche resistance becomes remarkable. Therefore, a configuration that balances charge of the n-type regions 103 and the p-type regions 104 is unavoidable and characteristics such as ON resistance are lower than those of a configuration that is charge balanced.

Embodiments of a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

A structure of a semiconductor device according to a first embodiment will be described. FIG. 1 is a plan view depicting a layout of a semiconductor device 50 according to the first embodiment semiconductor substrate when viewed from a front side thereof. The semiconductor device 50 according to the first embodiment and depicted in FIG. 1 is a super junction MOSFET having a trench gate structure in which a drift layer in an active region 10 is a first parallel pn layer 5 (refer to FIGS. 2, 3) in which n-type regions (first first-conductivity-type regions) 3 and p-type regions (first second-conductivity-type regions) 4 are disposed adjacent to and repeatedly alternating one another in the first direction X that is parallel to a main surface of a semiconductor substrate (semiconductor chip) 40.

The active region 10 is a region through which current flows when the MOSFET is in an ON state. The active region 10, for example, has a planar shape in which a part where a gate electrode pad 15 is formed is recessed and surrounds three sides of a perimeter of the gate electrode pad 15 that has a substantially rectangular planar shape. In FIG. 1, while a region beneath the gate electrode pad 15 is an intermediate region 30, the region beneath the gate electrode pad 15 may be the active region 10 and the active region 10 may have a substantially rectangular planar shape.

The active region 10 is provided in substantially a center (chip center) of the semiconductor substrate 40. The active region 10 is a region that is closer to the chip center than is at a center of an outermost trench 8 described hereinafter that, of multiple trenches 8, is closest to a chip end in the first direction X (refer to FIG. 2), the active region 10 being a region that, in the second direction Y that is parallel to a main surface of the semiconductor substrate 40 and orthogonal to the first direction X, is closer to the chip center than are ends (not depicted) of n$^+$-type source regions 7 described hereinafter (refer to FIG. 2).

In the active region 10, unit cells (constituent units of an element, refer to FIG. 2) of the MOSFET are disposed adjacent to one another. A periphery of the active region 10 is surrounded by an edge termination region 20 via the intermediate region 30. The intermediate region 30 is a region between the active region 10 and the edge termination region 20 and has a p$^{--}$-type RESURF region 21 disposed therein. The edge termination region 20 is a region between an inner end of a LOCOS film 26 (refer to FIG. 2) described hereinafter and an end (chip end) of the semiconductor substrate 40; the edge termination region 20 mitigates electric field at the front side of the semiconductor substrate 40 and sustains the breakdown voltage (withstand voltage).

In the edge termination region 20, for example, a voltage withstanding structure (refer to FIGS. 2, 3) such as a p$^-$-type channel stopper region 22 and a channel stopper electrode 28 described hereinafter is disposed. The breakdown voltage is a voltage limit at which no errant operation or damage of an element occurs. In FIG. 1, a gate metal layer 29 electrically connected to a source electrode 13 and the gate electrode pad 15 is depicted. A border between the active region 10 and the intermediate region 30, and a border between the intermediate region 30 and the edge termination region 20 are indicated by dashed lines. A contour of the p$^-$-type channel stopper region 22 is indicated by a finer dashed line than those of the border between the active region 10 and the intermediate region 30 and the border between the intermediate region 30 and the edge termination region 20. The contour of an outer periphery of the p$^-$-type channel stopper region 22 is a solid line at parts overlapping sides of the semiconductor substrate 40.

Between the active region 10 and the edge termination region 20, the intermediate region 30 is provided adjacent to the active region 10 and the edge termination region 20. The intermediate region 30 surrounds a periphery of the active region 10. The p$^{--}$-type RESURF region 21 is provided in the intermediate region 30 and surrounds a periphery of the active region 10. The p$^{--}$-type RESURF region 21 may extend from the intermediate region 30 to the edge termination region 20. The p⁻-type channel stopper region 22 is disposed separate from the p⁻⁻⁻-type RESURF region 21 and is disposed closer to the chip end than is the p⁻⁻⁻-type RESURF region 21.

The p⁻-type channel stopper region 22 is provided along the sides of the semiconductor substrate 40, in a substantially rectangular shape surrounding a part closer to the chip center than is the p⁻-type channel stopper region 22. The p⁻-type channel stopper region 22 is exposed by the ends of the semiconductor substrate 40, at the sides of the semiconductor substrate 40, is disposed slightly closer to the chip center than are the ends of the semiconductor substrate 40, and is not exposed by the ends of the semiconductor substrate 40, at corner parts (chip corner parts) of the semiconductor substrate 40. The corner parts of the semiconductor substrate 40 are parts that correspond to four vertices of the semiconductor substrate 40.

Figure 2:
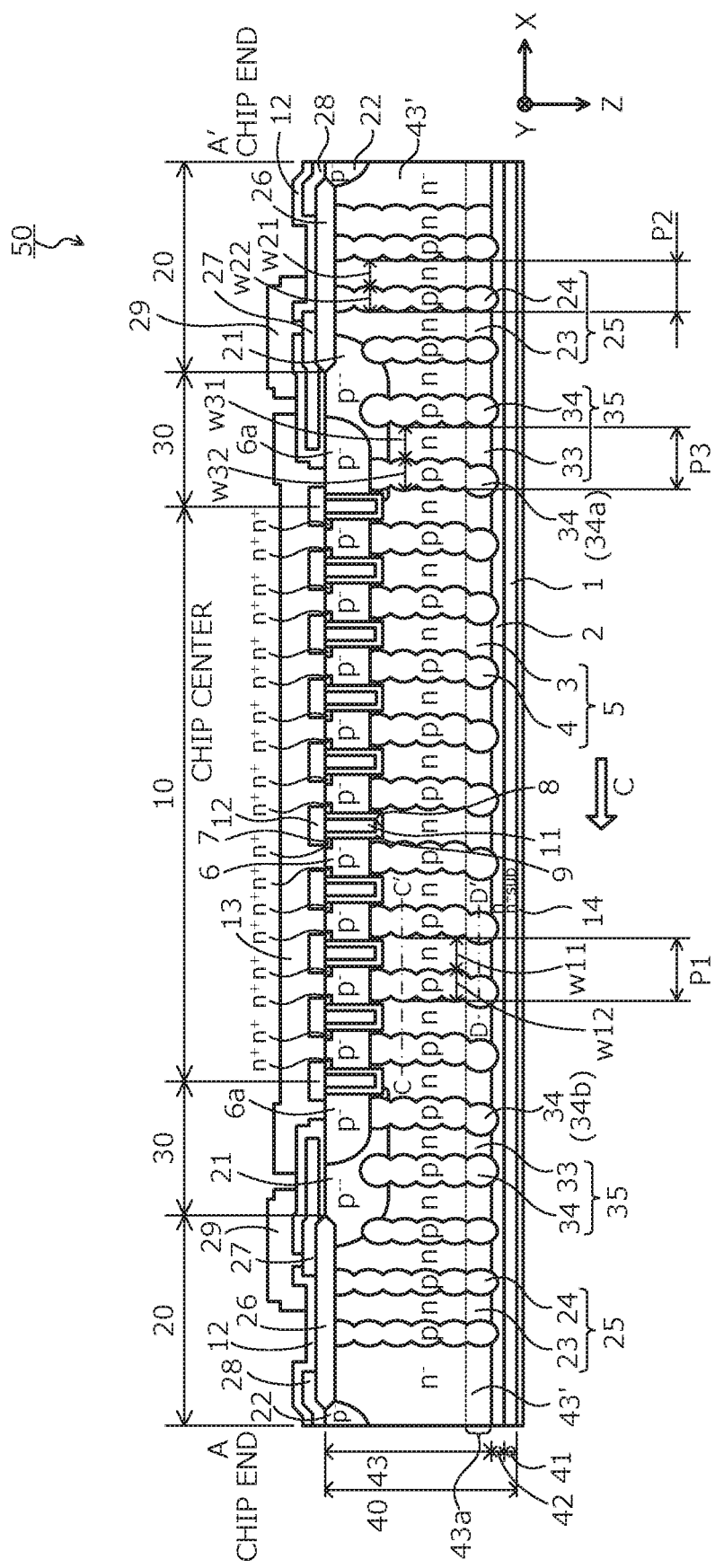
FIG. 2 is a cross-sectional view of a structure along cutting line A-A' in FIG. 1.

Cross-sectional views of the structure of the semiconductor device 50 according to the first embodiment will be described. FIG. 2 is a cross-sectional view of the structure along cutting line A-A' in FIG. 1. FIG. 3 is a cross-sectional view of the structure along cutting line B-B' in FIG. 1. FIG. 4 is a characteristics diagram depicting a plan view of the structure at cutting line C-C' in FIG. 2 and an impurity concentration distribution. FIG. 5 is a characteristics diagram of a plan view of the structure at cutting line D-D' in FIG. 2 and an impurity concentration distribution. In FIGS. 4 and 5, a layout of the first parallel pn layer 5 when viewed from the front side of the semiconductor substrate 40 is depicted below the impurity concentration distribution of the first parallel pn layer 5.

In FIG. 4, the impurity concentration distribution is that of second, third, fourth, and fifth-stage parts (correspond to reference characters 43b, 43c, 43d, 43e in FIG. 13) of an epitaxial layer 43 that is deposited in multiple stages and configures the first parallel pn layer 5. In FIG. 5, the impurity concentration distribution is that of a first-stage part (corresponds to reference character 43a in FIG. 13) of the epitaxial layer 43 that is deposited in multiple stages and configures the first parallel pn layer 5. In FIGS. 4 and 5, the n-type regions 3 and the p-type regions 4 are depicted with dot-dashed lines passing through respective centers of the n-type regions 3 and the p-type regions 4, the impurity concentration distributions of the n-type regions 3 and the p-type regions 4 are indicated by a dashed line and a solid line, respectively.

As depicted in FIGS. 2 and 3, in the semiconductor device 50 according to the first embodiment, in the active region 10, the intermediate region 30, and the edge termination region 20, the first, third, and second parallel pn layers 5, 35, 25 are provided in the semiconductor substrate 40, respectively. The semiconductor substrate 40 is an epitaxial substrate in which epitaxial layers 42, 43 that constitute an n-type buffer region 2 and the first to the third parallel pn layers 5, 25, 35 are sequentially deposited on a front surface (top surface) of an n⁺-type substrate 41 that constitutes an n⁺-type drain region (low resistance layer) 1. Structures of the first to the third parallel pn layers 5, 25, 35 will be described hereinafter.

In the active region 10, a p⁻-type base region 6 is provided between the front surface (main surface having the epitaxial layer 43) of the semiconductor substrate 40 and the first parallel pn layer 5. The p⁻-type base region 6 is in contact with the n-type regions 3 and the p-type regions 4 of the first parallel pn layer 5. Between the front surface of the semiconductor substrate 40 and the p⁻-type base region 6, the n⁺-type source regions 7 are selectively provided in contact with the p⁻-type base region 6. The p⁻-type base region 6 and the n⁺-type source regions 7 are each selectively exposed at the front surface of the semiconductor substrate 40 by contact holes provided in an interlayer insulating film 12 described hereinafter.

Between the front surface of the semiconductor substrate 40 and the p⁻-type base region 6, a p⁺-type contact region (not depicted) may be provided. When the p⁺-type contact region is provided, the n⁺-type source regions 7 and the p⁺-type contact region are each selectively exposed at the front surface of the semiconductor substrate 40 by contact holes provided in the interlayer insulating film 12 described hereinafter. The p⁺-type contact region is adjacent to the p⁻-type base region 6 in the depth direction Z and is adjacent to the n⁺-type source regions 7 in the first direction X. The trenches 8 penetrate the n⁺-type source regions 7 and the p⁻-type base region 6, and reach the n-type regions 3 of the first parallel pn layer 5.

While not depicted, the p⁻-type base region 6, the n⁺-type source regions 7, and the p⁺-type contact region, as viewed from the front surface of the semiconductor substrate 40, are disposed between (mesa region) adjacent trenches 8, in a linear shape that is parallel to the trenches 8 and extends in a same direction (the second direction Y) as that of the trenches 8. In the mesa regions, the p⁻-type base region 6 and the p⁺-type contact region are all connected to the p⁻⁻⁻-type RESURF region 21 and are electrically connected to one another by the p⁻⁻⁻-type RESURF region 21.

The trenches 8 extend to the intermediate region 30 in a stripped pattern along the second direction Y and terminate in the p⁻⁻⁻-type RESURF region 21. In the first direction X, an outermost half of the outermost trench 8 closest to the chip end in the first direction X is disposed in the intermediate region 30. As described above, the center of the outermost trench 8 in the first direction X is the border between the active region 10 and the intermediate region 30. The trenches 8 are provided so as to reach the n-type regions 3 of the first parallel pn layer 5 in the depth direction Z, and are not provided in the p-type regions 4 of the first parallel pn layer 5. In the trenches 8, gate electrodes 11 are provided via a gate insulating film 9.

The interlayer insulating film 12 is provided at an entire area of the front surface of the semiconductor substrate 40. Contact holes that penetrate the interlayer insulating film 12 in the depth direction Z and reach the semiconductor substrate 40 are provided. In the contact holes in the active region 10, the p⁻-type base region 6 and the n⁺-type source regions 7 are exposed. The source electrode 13 is provided at an entire area of the front surface of the semiconductor substrate 40 in the active region 10, the source electrode being in contact with the p⁻-type base region 6 and the n⁺-type source regions 7 in the contact holes, and electrically connected to the p⁻-type base region 6 and the n⁺-type source regions 7.

When the p⁺-type contact region is provided, the source electrode 13 is in contact with the p⁺-type contact region and the n⁺-type source regions 7 in the contact holes, and is electrically connected to the p⁻-type base region 6, the p⁺-type contact region, and the n⁺-type source regions 7. Between the n⁺-type drain region 1 and the first to the third parallel pn layers 5, 25, 35 and n⁻-type drift regions 43' described hereinafter, the n-type buffer region 2 is provided in contact with the first to the third parallel pn layers 5, 25, 35, the n⁻-type drift regions 43', and the n⁺-type drain region 1.

The n-type buffer region 2 is configured by the n-type epitaxial layer 42. Further, the n⁺-type drain region 1 is configured by the n⁺-type substrate 41. The n-type buffer region 2 and the n⁺-type drain region 1 have a uniform thickness, spanning an entire area of the semiconductor substrate 40. A uniform thickness means a thickness that is substantially the same and within a range that includes an allowable error due to process variation. A drain electrode 14 is provided at an entire area of a back surface (main surface (rear surface of the n⁺-type substrate 41) including the n⁺-type substrate 41) of the semiconductor substrate 40. The drain electrode 14 is in contact with the n⁺-type drain region 1 and is electrically connected to the n⁺-type drain region 1.

In the intermediate region 30, between the front surface of the semiconductor substrate 40 and the third parallel pn layers 35, the p⁻-type base region 6 extends from the active region 10. Hereinafter, the p⁻-type base region 6 in the intermediate region 30 is indicated by a reference character 6a. The p⁻-type base region 6a terminates closer to the chip center than is the border between the intermediate region 30 and the edge termination region 20. Further, between the front surface of the semiconductor substrate 40 and the third parallel pn layers 35, the p⁻⁻⁻-type RESURF region 21 is provided closer to the chip end than is the p⁻-type base region 6a and is in contact with the p⁻-type base region 6a.

The p⁻⁻⁻-type RESURF region 21, at a position closer to the chip end than is the p⁻-type base region 6a, is exposed at the front surface of the semiconductor substrate 40 and extends from the intermediate region 30 to the edge termination region 20. The p⁻⁻⁻-type RESURF region 21 reaches a position (depth) that is deeper from the front surface of the semiconductor substrate 40 toward the n⁺-type drain region 1 than is the p⁻-type base region 6a. The p⁻-type RESURF region 21 extends between the p⁻-type base region 6a and the third parallel pn layers 35, toward the chip center, and reaches the outermost trench 8 in the first direction X, the p⁻⁻⁻-type RESURF region 21 surrounding a bottom corner part of the outermost trench 8, the bottom corner part that faces the chip end (FIG. 2).

The p⁻⁻⁻-type RESURF region 21 extends between the p⁻-type base region 6a and the third parallel pn layers 35, toward the chip center, and surrounds bottom corner parts of ends of all the trenches 8, the ends (ends in a longitudinal direction) in the second direction Y (FIG. 3). The bottom corner parts of the trenches 8 are borders between sidewalls and the bottoms of the trenches 8. In the intermediate region 30, at the front surface of the semiconductor substrate 40, the source electrode 13 extends from the active region 10 and is in contact with the p⁻-type base region 6a in a contact hole and is electrically connected to the p⁻-type base region 6a. The source electrode 13 is provided on the interlayer insulating film 12 in the intermediate region 30. Further, the source electrode 13 is separate from and insulated from the gate metal layer 29 that is provided at an outer side of the source electrode 13 closer to the chip end than is the source electrode 13.

In the edge termination region 20, the second parallel pn layers 25 are exposed at the front surface of the semiconductor substrate 40. Between the second parallel pn layers 25 in the edge termination region 20 and the ends of the semiconductor substrate 40, the n⁻-type drift regions 43' are provided adjacent to the second parallel pn layers 25. The n⁻-type drift regions 43' are exposed at the ends of the semiconductor substrate 40. The n⁻-type drift regions 43' are parts of the epitaxial layer 43 of an n⁻-type, the parts that are left at a same impurity concentration as that during deposition by not ion implanting an impurity into the n⁻-type epitaxial layer 43 during formation of the first to the third parallel pn layers 5, 25, 35.

Between the front surface of the semiconductor substrate 40 and the type drift regions 43', the p⁻-type channel stopper region 22 is selectively provided in contact with the n⁻-type drift regions 43'. The p⁻-type channel stopper region 22 is exposed at the front surface and the ends of the semiconductor substrate 40. Between the p⁻⁻⁻-type RESURF region 21 and the p⁻-type channel stopper region 22, an entire area of the front surface of the semiconductor substrate is covered by the LOCOS film (Local Oxidation of Silicon) 26.

The front surface of the semiconductor substrate 40 in the edge termination region 20, excluding an entire surface where the p⁻-type channel stopper region 22 is exposed, is covered by the LOCOS film 26. Therefore, the LOCOS film 26 surrounds a periphery of the active region 10 and sandwiches the intermediate region 30 therebetween. On the LOCOS film 26, a gate polysilicon layer 27 is provided so as to surround a periphery of the active region 10. The gate polysilicon layer 27 extends from the edge termination region 20 to the intermediate region 30. The gate polysilicon layer 27 may extend closer to the chip end than is the p⁻⁻⁻-type RESURF region 21.

The gate polysilicon layer 27, for example, at the ends of the trenches 8 in the second direction Y, is in contact with the gate electrodes 11 and is gate wiring electrically connected to all the gate electrodes 11. The gate polysilicon layer 27 is electrically insulated from the semiconductor substrate 40 by the LOCOS film 26 and the gate insulating film 9 that extends on the front surface of the semiconductor substrate 40, from the sidewalls of the trenches 8. The channel stopper electrode 28 is disposed separate from the gate polysilicon layer 27 and surrounds a periphery of the LOCOS film 26.

The channel stopper electrode 28 is in contact with the p⁻-type channel stopper region 22 and is electrically connected to the p⁻-type channel stopper region 22. The channel stopper electrode 28 may extend on the LOCOS film 26, toward the chip center. The LOCOS film 26, the gate polysilicon layer 27, and the channel stopper electrode 28 are covered by the interlayer insulating film 12. The source electrode 13, the gate polysilicon layer 27, and the channel stopper electrode 28 are electrically insulated from each other by the interlayer insulating film 12.

The gate metal layer 29 is provided on the gate polysilicon layer 27 in the edge termination region 20, via the interlayer insulating film 12. The gate metal layer 29 faces an entire periphery of the gate polysilicon layer 27. Between the gate metal layer 29 and the gate polysilicon layer 27, a contact hole is provided in the interlayer insulating film 12 so as to surround a periphery of the active region 10. The gate metal layer 29 is in contact with the gate polysilicon layer 27 in the contact hole of the interlayer insulating film 12 and is electrically connected to the gate polysilicon layer 27.

The contact hole in which the gate metal layer 29 and the gate polysilicon layer 27 contact each other, for example, is provided at a position that faces the LOCOS film 26 in the depth direction Z. The gate metal layer 29 is disposed separate from the source electrode 13. The gate metal layer 29 may extend to the intermediate region 30 to an extent of not being in contact with the source electrode 13. The gate metal layer 29 may extend closer to the chip end than is the gate polysilicon layer 27. The gate metal layer 29, for example, is provided closer to the chip center than is the channel stopper electrode 28 and is electrically connected to the gate electrode pad 15.

Next, a structure of the first to the third parallel pn layers 5, 25, 35 will be described. As described above, the first to the third parallel pn layers 5, 25, 35 are disposed in the active region 10, the edge termination region 20, and the intermediate region 30, respectively. The first to the third parallel pn layers 5, 25, 35, for example, are formed by a multi-stage epitaxial method of forming, in epitaxial layers 43a, 43b, 43c, 43d, 43e that are deposited at multiple stages, n-type regions (first, second, third first-conductivity-type regions) 3, 23, 33 and p-type regions (first, second, third second-conductivity-type regions) 4, 24, 34 so that regions of a same conductivity type face each other in the depth direction Z (refer to FIGS. 11, 12).

The first parallel pn layer 5 includes the n-type regions 3 and the p-type regions 4 that are disposed adjacently to each other and repeatedly alternate each other in the first direction X in the active region 10. In the first parallel pn layer 5, at each side thereof closest to the chip end in the first direction X, one of the n-type regions 3 is disposed. The n-type regions 3 and the p-type regions 4 extend in a linear shape along the second direction Y. Further, the n-type regions 3 and the p-type regions 4 extend in a substantially linear shape along the depth direction Z. In the first parallel pn layer 5, widths w11, w12 of the n-type regions 3 and the p-type regions 4 are about equal and total impurity concentrations of the n-type regions 3 and the p-type regions 4 are about equal, thereby balancing charge.

Impurity concentration gradients along the first direction X of the n-type regions 3 and the p-type regions 4 of the first parallel pn layer 5 are symmetrical at parts (first and third parts) closer to a source (toward the source electrode 13) than are parts (second and fourth parts) closer to a drain (toward the drain electrode 14) refer to FIG. 4), the impurity concentration gradients along the first direction X of the n-type regions 3 and the p-type regions 4 of the first parallel pn layer 5 being asymmetrical at the parts closer to the drain (refer to FIG. 5). In the n-type regions 3, the impurity concentration gradient being symmetrical along the first direction X means that the n-type regions 3 each exhibits a maximum value (peak) at a center (peak position: first peak position) along the first direction X and has an impurity concentration distribution that gradually decreases from the peak position to pn junctions with the p-type regions 4 adjacent thereto on both sides in the first direction X; and means that the impurity concentration gradients each is symmetrical with respect to the peak position as a reference. A surface of the first parallel pn layer 5 facing the source electrode 13 is regarded as an upper surface and a surface thereof facing the drain electrode 14 is regarded as a lower surface.

In the n-type regions 3, the impurity concentration gradients along the first direction X being asymmetrical means that the n-type regions 3 each exhibits the maximum value at a position (peak position: the first peak position) that is shifted in the first direction X from the center along the first direction X and has an impurity concentration distribution that gradually decreases from the peak position to the pn junctions with the p-type regions 4 adjacent thereto on both sides in the first direction X; and means that the impurity concentration gradients each differs on each side relative to the peak position as a reference (has a steep impurity concentration gradient and a gradual impurity concentration gradient). Description regarding the impurity concentration gradients of the p-type regions 4 being symmetrical or asymmetrical along the first direction X is equivalent to replacing the peak positions of the impurity concentrations and the impurity concentration gradients of "the n-type regions 3" with the peak positions (second peak positions) of the impurity concentrations and the impurity concentration gradients of "the p-type regions 4" in the description regarding "the n-type regions 3".

In the present embodiment, of the n⁻-type epitaxial layers (i.e., reference characters 43a, 43b in FIGS. 11, 12) from a first stage to that of a stage count (two stages in FIGS. 11, 12) that is at most half of a total stage count (five stages in FIGS. 11, 12) of the stages of the epitaxial layer 43 that constitutes the first parallel pn layer 5 that is deposited on the n-type epitaxial layer 42, the n-type regions 3 and the p-type regions 4 of an n⁻-type epitaxial layer of at least one stage from a side closest to the n⁺-type drain region 1 have impurity concentration gradients that are asymmetrical along the first direction X.

The n-type regions 3 and the p-type regions 4 of the n⁻-type epitaxial layers of remaining stages have impurity concentration gradients that are symmetrical along the first direction X. The n⁻-type epitaxial layers of the remaining stages are the n⁻-type epitaxial layers (corresponds to reference characters 43c to 43e in FIGS. 11 and 12) of the third to the fifth stages, or when configuration is such that the impurity concentration gradients of the n-type regions 3 and the p-type regions 4 are asymmetrical along the first direction X in only the n⁻-type epitaxial layer 43a of the first stage, the n⁻-type epitaxial layers of the remaining stages are the n⁻-type epitaxial layers (corresponds to reference characters 43b to 43e in FIGS. 11 and 12) of the second to the fifth stages.

Figure 11:
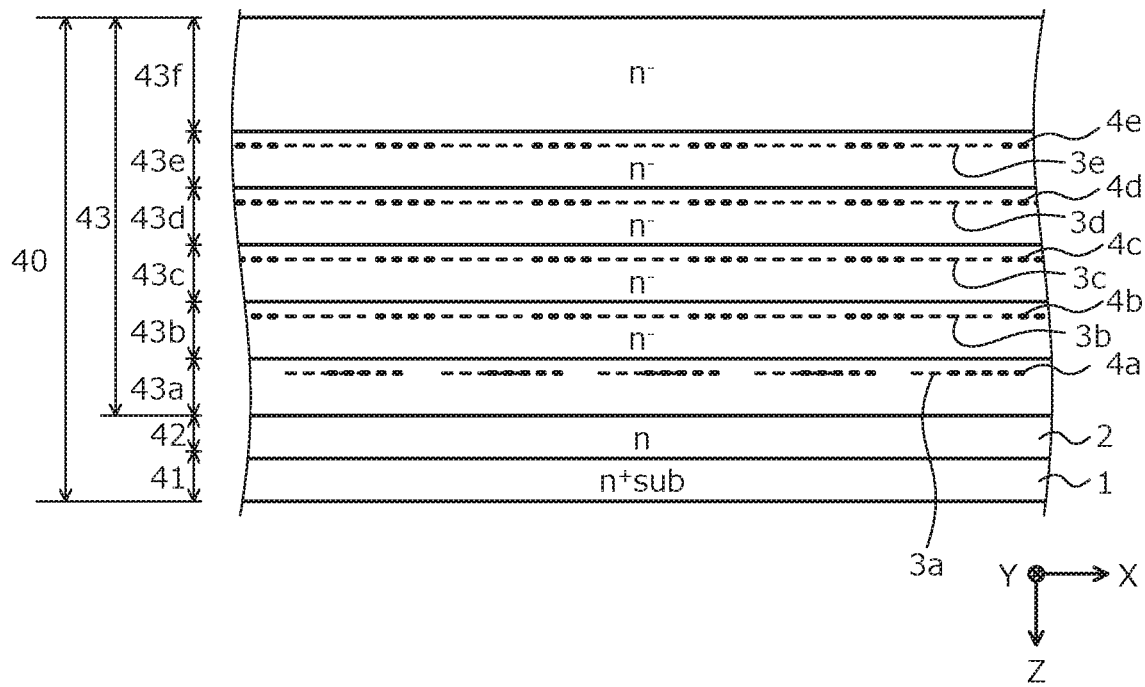
FIG. 11 is a cross-sectional view depicting a state of the semiconductor device according to the first embodiment during manufacture.
Figure 12:
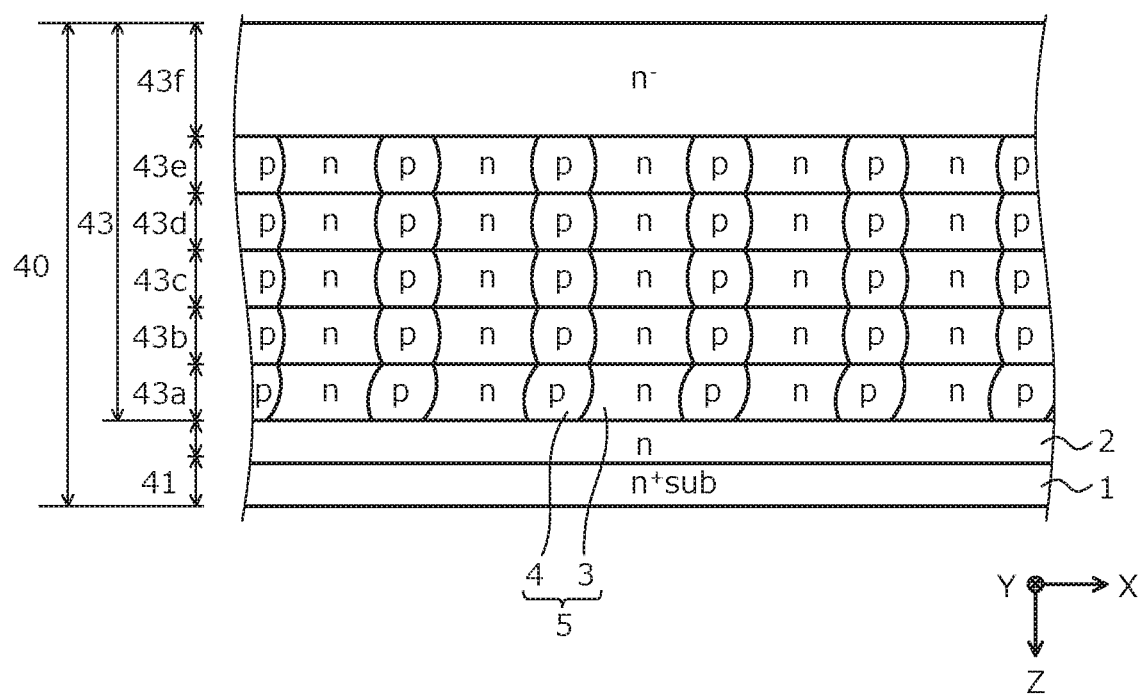
FIG. 12 is a cross-sectional view depicting a state of the semiconductor device according to the first embodiment during manufacture.

Here, in only the n⁻-type epitaxial layer 43a of the first stage, the impurity concentration gradients of the n-type regions 3 and the p-type regions 4 are asymmetrical along the first direction X (refer to FIGS. 2, 11, and 12). The n-type regions 3 and the p-type regions 4 of the n⁻-type epitaxial layer 43a of the first stage have areas (first areas between facing horizontal arrows in FIG. 5) 5a of a high impurity concentration, where the impurity concentration gradient along the first direction X is relatively steep, second areas (areas other than first areas 5a) 5b of a low impurity concentration, where the impurity concentration gradient along the first direction X is relatively gradual, the first and the second areas being adjacent to and repeatedly alternating one another along the first direction X.

In setting only the n⁻-type epitaxial layer 43a of the first stage to have impurity concentration gradients that are asymmetrical along the first direction X, as described hereinafter, an ion implantation mask 63 (refer to FIG. 8) used in a second ion implantation 64 for forming the p-type regions in the n⁻-type epitaxial layer 43a is disposed shifted to a greater extent in one direction (hereinafter, column shifting direction) C along the first direction X than is an ion implantation mask 67 (refer to FIG. 10) that has a pattern similar to that of the ion implantation mask 63 and that is used in a fourth ion implantation 68 for forming the p-type regions 4 in the epitaxial layers 43b to 43e of the n⁻-type of the second to the fifth stages.

In this manner, the p-type regions 4 of the n⁻-type epitaxial layer 43a of the first stage are formed, whereby the p-type regions 4 of the n⁻-type epitaxial layer 43a of the first stage are disposed at positions shifted to a greater extent in the column shifting direction C than are the p-type regions 4 of the other epitaxial layers 43b to 43e of the n⁻-type. A shifting amount d in the column shifting direction C for the p-type regions 4 of the n⁻-type epitaxial layer 43a of the first stage uses the positions of the p-type regions 4 of the other epitaxial layers 43b to 43e of the n⁻-type as a reference and is, for example, about 7% to 18% of the repeat pitch of the n-type regions 3 and the p-type regions 4.

Therefore, along the first direction X, in all the p-type regions 4 of the type epitaxial layer 43a of the first stage, the peak position where the impurity concentration is greatest is at a position that is shifted from the center of the corresponding p-type region 4 by the shifting amount d in the first direction X. In all the n-type regions 3 of the n⁻-type epitaxial layer 43a of the first stage, the peak position where the impurity concentration is greatest along the first direction X is at a position that is shifted from the center of the corresponding n-type region 3 by the shifting amount d in the first direction X.

Of the stages of the n⁻-type epitaxial layer 43 deposited in multiple stages on the n-type epitaxial layer 42 and constituting the first parallel pn layer 5, from the first stage, the n-type regions 3 and the p-type regions 4 of the n⁻-type epitaxial layers of how many stages among the n⁻-type epitaxial layers of a stage count that is at most half of the total stage count are to be configured to have an impurity concentration gradient that is asymmetrical along the first direction X is determined based on a desired breakdown voltage and thickness of the epitaxial layers 43a to 43e of the n⁻-type. As the thicknesses of the type epitaxial layers 43a to 43e decrease, the breakdown voltage decreases.

In the third parallel pn layers 35, the n-type regions 33 and the p-type regions 34 in the intermediate region 30 are disposed adjacent to and repeatedly alternate one another in the first direction X. The third parallel pn layers 35 are adjacent to sides of the first parallel pn layer 5, the sides closest to the chip ends. The p-type regions 34 are disposed at sides of the third parallel pn layers 35, the sides nearest the chip center in the first direction X. The p-type regions 34 disposed at the sides of the third parallel pn layers 35, the sides closest the chip center in the first direction X, are in contact with the n-type regions 3 of the first parallel pn layer 5, disposed closest to the chip ends along the first direction X. The n-type regions 33 are disposed at sides of the third parallel pn layers 35, the sides nearest the chip ends along the first direction X.

The n-type regions 33 and the p-type regions 34, similarly to the n-type regions 3 and the p-type regions 4 of the first parallel pn layer 5, extend in a linear shape along the second direction Y and extend in a linear shape in the depth direction Z. In the third parallel pn layers 35, widths w31, w32 of the n-type regions 33 and the p-type regions 34 are about equal and total impurity amounts of the n-type regions 33 and the p-type regions 34 are about equal, thereby balancing charge. The widths w31, w32 of the n-type regions 33 and the p-type regions 34 of the third parallel pn layers 35 are equal to widths w11, w12 of the n-type regions 3 and the p-type regions 4 of the first parallel pn layer 5. As a result, a repeat pitch P3 (sum of the width w31 and the width w32) of the n-type regions 33 and the p-type regions 34 of the third parallel pn layers 35 is equal to a repeat pitch P1 (sum of the width w11 and the width w12) of the n-type regions 3 and the p-type regions 4 of the first parallel pn layer 5.

The third parallel pn layers 35 have a configuration in which only the p-type regions 34 (34a, 34b) disposed nearest the chip center in the first direction X have impurity concentration gradients that, similarly to the p-type regions 4 of the first parallel pn layer 5, are symmetrical along the first direction X at a part toward the source and are asymmetrical at a part toward the drain. Therefore, in the third parallel pn layers 35, only the p-type regions 34 (34a, 34b) disposed closest to the chip center in the first direction X, the p-type regions 34 of the type epitaxial layer 43a of the first stage are disposed at positions that are shifted to a greater extent in the column shifting direction C than are the p-type regions 34 of the other epitaxial layers 43b to 43e of the n⁻-type.

In the p-type regions 34a, 34b disposed closest to the chip center along the first direction X in the third parallel pn layers 35, parts thereof where the impurity concentration gradients are asymmetrical along the first direction X are present, whereby the n-type region 33 that is adjacent to a side (the side nearest the chip end) of the p-type region 34a where the p-type region 34 of the n⁻-type epitaxial layer 43a of the first stage is shifted toward the chip center has a width that is wider than that of the other n-type regions 33 and has a low impurity concentration. Therefore, in this n-type region 33, during an OFF state, the spreading of a depletion layer from pn junctions with the adjacent p-type regions 34 becomes difficult and electric field strength increases, whereby the breakdown voltage at the n-type regions 33 decreases.

Furthermore, the n-type region 33 adjacent to the p-type region 34b where the p-type region 34 of the n⁻-type epitaxial layer 43a of the first stage is shifted toward the chip end has a width that is narrower than that of the other n-type regions 33 and has a high impurity concentration. Therefore, this n-type region 33 becomes a place where electric field concentrates and the breakdown voltage at the n-type region 33 decreases. Thus, the n⁺-type source regions 7 are not disposed in the p⁻-type base region 6a of the intermediate region 30, a mathematical area of a parasitic diode formed by pn junctions between the type base region 6a and the n-type regions 33 is increased, and decreases in the breakdown voltage at these n-type regions 33 is suppressed.

In the second parallel pn layers 25, the n-type regions 23 and the p-type regions 24 are disposed adjacent to and repeatedly alternating one another along the first direction X in the edge termination region 20. The second parallel pn layers 25 are adjacent to sides of the third parallel pn layers 35, the sides closest to the chip ends. The p-type regions 24 are disposed at sides of the second parallel pn layers 25, the sides closest to the chip center along the first direction X. The p-type regions 24 disposed at the sides of the second parallel pn layers 25 closest to the chip center along the first direction X are in contact with the n-type regions 33 disposed at the sides of the third parallel pn layers 35, the sides closest to the chip ends in the first direction X. At the sides of the second parallel pn layers 25, the sides closest to the chip ends along the first direction X, the n-type regions 23 are disposed in contact with the n⁻-type drift regions 43'.

The n-type regions 23 and the p-type regions 24, similarly to the n-type regions 3 and the p-type regions 4 of the first parallel pn layer 5, extend in a linear shape along the second direction Y and extend in a linear shape in the depth direction Z. In the second parallel pn layers 25, widths w21, w22 of the n-type regions 23 and the p-type regions 24 are about equal and total impurity amounts of the n-type regions 23 and the p-type regions 24 are about equal, thereby balancing charge. The widths w21, w22 of the n-type regions 23 and the p-type regions 24 of the second parallel pn layers 25, are respectively narrower than the widths w11, w12 of the n-type regions 3 and the p-type regions 4 of the first parallel pn layer 5. Therefore, a repeat pitch P2 (sum of the width w21 and the width w22) of the n-type regions 23 and the p-type regions 24 of the second parallel pn layers 25 is narrower than the repeat pitch P1 (sum of the width w11 and the width w12) of the n-type regions 3 and the p-type regions 4 of the first parallel pn layer 5.

The n-type regions 23 and the p-type regions 24 of the second parallel pn layers 25 have impurity concentration gradients that are symmetrical along the first direction X. Description of the impurity concentration gradients of the n-type regions 23 and the p-type regions 24 being symmetrical along the first direction X is equivalent to replacing, respectively, in the description regarding "the n-type regions 3", the peak positions of the impurity concentrations and the impurity concentration gradients of "the n-type regions 3" of the first parallel pn layer 5 with the peak positions (third peak positions) of the impurity concentrations and the impurity concentration gradients of "the n-type regions 23", and the peak positions (fourth peak positions) of the impurity concentrations and the impurity concentration gradients of "the p-type regions 24".

The impurity concentration gradient being symmetrical along the first direction X indicates that the p-type regions 24 provided in the n$^-$-type epitaxial layer 43a of the first stage of the second parallel pn layers 25 are not disposed like the p-type regions 4 and the p-type region 34a provided in the n$^-$-type epitaxial layer 43a of the first stage of the first parallel pn layer 5 and the third parallel pn layers 35 at positions shifted in the column shifting direction C to a greater extent than are the p-type regions 4 and the p-type region 34a of the other epitaxial layers 43b to 43e of the n$^-$-type.

The p-type regions 4, 24, 34 of the first to the third parallel pn layers 5, 25, 35 may extend in the depth direction Z into the n-type buffer region 2. The n-type regions 23 and the p-type regions 24 of the second parallel pn layers 25, for example, reach the n-type buffer region 2 from the front surface of the semiconductor substrate 40. The p-type regions 34 of the third parallel pn layers 35, for example, may extend in a thickness direction (direction parallel to the depth direction Z, from a back surface of the semiconductor substrate 40 to the front surface) of the semiconductor substrate 40 into the p$^{---}$-type RESURF region 21. The p-type regions 34 of the third parallel pn layers 35, for example, need not reach the front surface of the semiconductor substrate 40 in the thickness direction of the semiconductor substrate 40.

While not particularly limited hereto, for example, when the super junction MOSFET according to the first embodiment has a breakdown voltage of 100V, dimensions and impurity concentrations of regions have the following values. The n-type buffer region 2 (the n-type epitaxial layer 42) has a thickness of, for example, about 3.5 μm. The n-type buffer region 2 has an impurity concentration in a range, for example, from $1.0E+16/cm^3$ to $3.0E+16/cm^3$. The n$^-$-type epitaxial layer 43 has a thickness of, for example, 2.0 μm. Depths of the p$^-$-type base region 6 and the p$^{---}$-type RESURF region 21 are, for example, 1.0 μm and 1.5 μm, respectively. The p$^-$-type base region 6 has an impurity concentration in a range, for example, from $5.0E+16/cm^3$ to $5.0E+17/cm^3$. The p$^{---}$-type RESURF region 21 has an impurity concentration in a range, for example, from $5.0E+15/cm^3$ to $2.0E+17/cm^3$. The edge termination region 20 has a width of, for example, 50 μm. The intermediate region 30 has a width of, for example, 30 μm. "E" means power of 10 and, for example, $1.0E+16/cm^3$ means $1\times10^{16}/cm^3$.

The widths w11, w12 of the n-type regions 3 and the p-type regions 4 of the first parallel pn layer 5, for example, are in a range from 1 μm to 2 μm (repeat pitch is in a range from 2 μm to 4 μm). Impurity concentrations of the n-type regions 3 and the p-type regions 4 of the first parallel pn layer 5, for example, are in a range from $2.0E+16/cm^3$ to $5.0E+16/cm^3$. The widths w21, w22 of the n-type regions 23 and the p-type regions 24 of the second parallel pn layers 25, for example, are in a range from 0.7 μm to 1.5 μm (repeat pitch is in a range from 1.4 μm to 3 μm). Impurity concentrations of the n-type regions 23 and the p-type regions 24 of the second parallel pn layers 25, for example, are in a range from $1.0E+16/cm^3$ to $4.0E+16/cm^3$. The widths w31, w32 of the n-type regions 33 and the p-type regions 34 of the third parallel pn layers 35 are, for example, 1.5 μm (repeat pitch is 3.0 μm). Impurity concentrations of the n-type regions 33 and the p-type regions 34 of the third parallel pn layers 35, for example, are in a range from $2.0E+16/cm^3$ to $5.0E+16/cm^3$.

Figure 14:
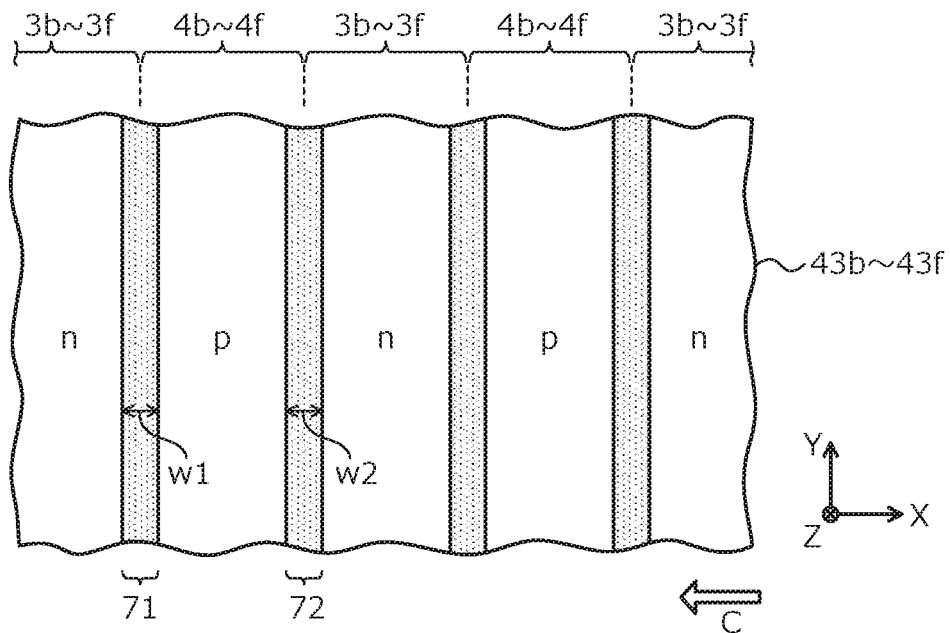
FIG. 14 is a plan view depicting a state during manufacture when the parallel pn layer of the semiconductor device according to the first embodiment is viewed from the front surface of the semiconductor substrate.
Figure 15:
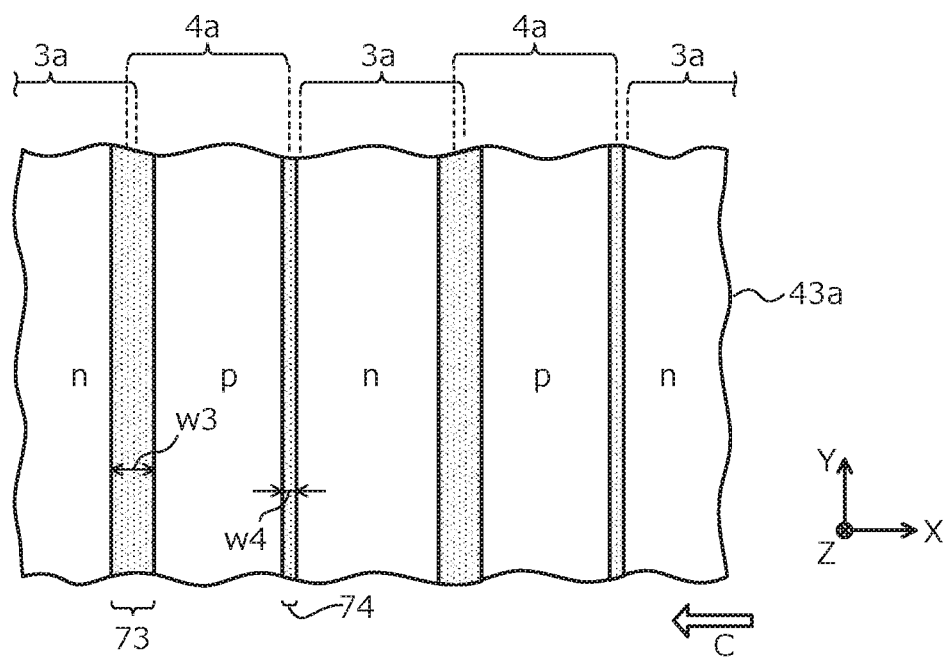
FIG. 15 is a plan view depicting a state during manufacture when the parallel pn layer of the semiconductor device according to the first embodiment is viewed from the front surface of the semiconductor substrate.

Next, a method of manufacturing the semiconductor device 50 according to the first embodiment will be described. FIG. 6 is a flowchart of an outline of the method of manufacturing the semiconductor device according to the first embodiment. FIGS. 7, 8, 9, 10, 11, 12, and 13 are cross-sectional views depicting states of the semiconductor device according to the first embodiment during manufacture. FIGS. 14 and 15 are plan views depicting states during manufacture when the parallel pn layer of the semiconductor device according to the first embodiment is viewed from the front surface of the semiconductor substrate. FIGS. 7 to 15 depict states of the active region 10. States of the edge termination region 20 and the intermediate region 30 will be described with reference to FIG. 2.

Figure 7:
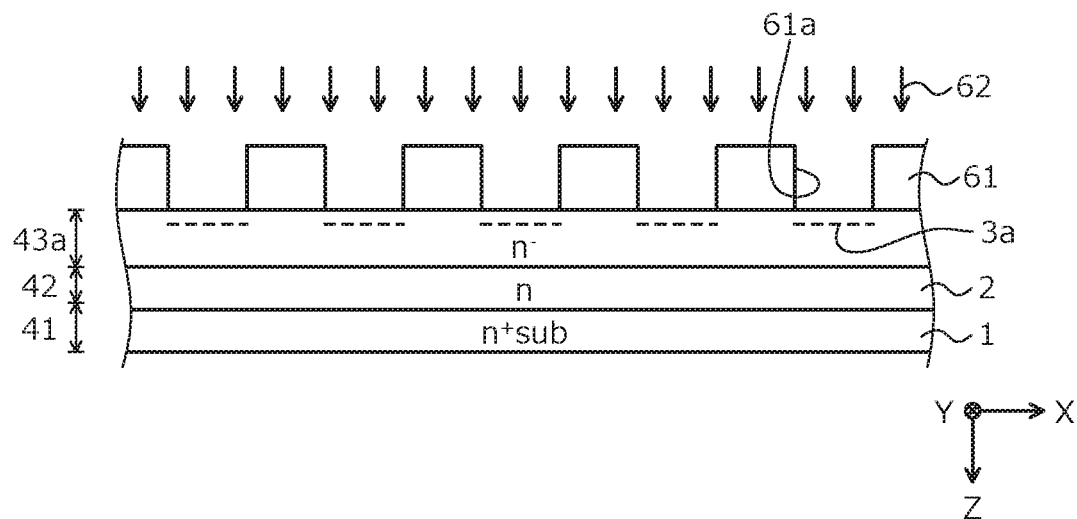
FIG. 7 is a cross-sectional view depicting a state of the semiconductor device according to the first embodiment during manufacture.

First, as depicted in FIG. 7, the n$^+$-type substrate (semiconductor wafer) 41 that becomes the n$^+$-type drain region 1 is prepared. Next, on the front surface of the n$^+$-type substrate 41, the n-type epitaxial layer 42 that becomes the n-type buffer region 2 is deposited (formed) by epitaxial growth (step S1). Next, the n$^-$-type epitaxial layer 43a of the first stage is deposited on the n-type epitaxial layer 42 by epitaxial growth, as a part of the epitaxial layer 43 configuring the first to the third parallel pn layers 5, 25, 35 (step S2).

Next, on the n$^-$-type epitaxial layer 43a, an ion implantation mask 61 opened at parts corresponding to formation regions of the n-type regions 3 of the first parallel pn layer 5, formation regions (not depicted) of the n-type regions 23 of the second parallel pn layers 25, and formation regions (not depicted) of the n-type regions 33 of the third parallel pn layers 35 is formed. The ion implantation mask 61 is, for example, a resist film. Widths (opening widths) of openings 61a of the ion implantation mask 61 are narrower in the edge termination region 20 than in the active region 10 and the intermediate region 30 (similarly regarding the ion implantation masks 63, 65, 67 described hereinafter).

Next, a first ion implantation 62 of ion implanting an n-type impurity such as, for example, phosphorus (P) is performed using the ion implantation mask 61 as a mask (step S3). By the first ion implantation 62, n-type impurity implanted regions 3a are selectively formed in surface regions of the n$^-$-type epitaxial layer 43a at a predetermined repeat pitch in the active region 10, the edge termination region 20, and the intermediate region 30, respectively. In FIG. 7, the n-type impurity implanted regions 3a are indicated by a dashed line (similarly in n-type impurity implanted regions in FIGS. 8 to 11). Subsequently, the ion implantation mask 61 is removed.

Figure 8:
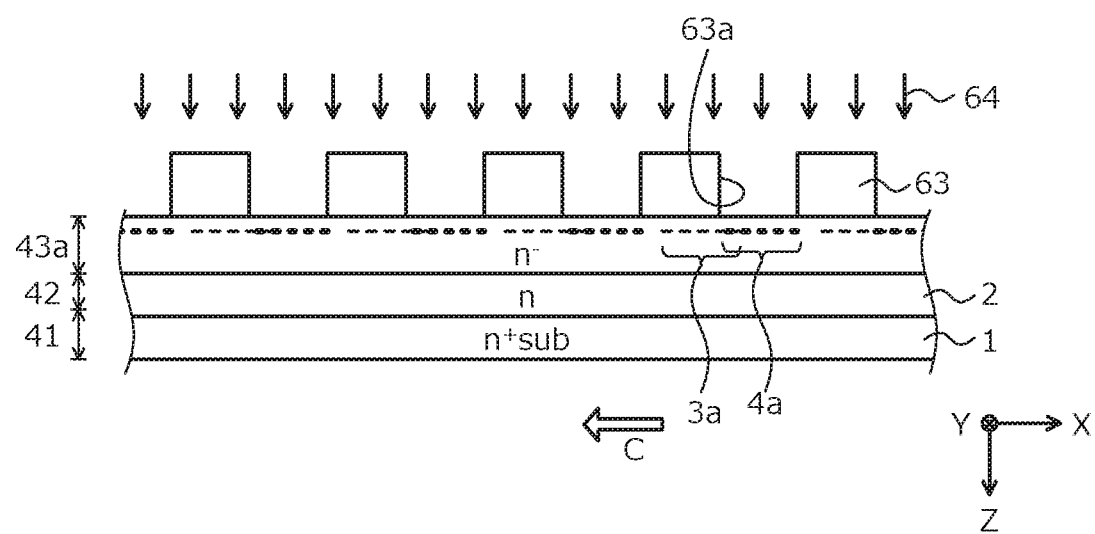
FIG. 8 is a cross-sectional view depicting a state of the semiconductor device according to the first embodiment during manufacture.

Next, as depicted in FIG. 8, on the n$^-$-type epitaxial layer 43a, the ion implantation mask 63 opened at parts corresponding to formation regions of the p-type regions 4 of the first parallel pn layer 5, formation regions (not depicted) of the p-type regions 24 of the second parallel pn layers 25, and formation regions (not depicted) of the p-type regions 34 of the third parallel pn layers 35 is formed. Openings 63a of the ion implantation mask 63 are formed shifted in one direction (the column shifting direction C) by the predetermined shifting amount d so that different parts of the n-type impurity implanted regions 3a are exposed in the openings 63a, respectively.

However, in the second parallel pn layers 25 of the edge termination region 20, the ion implantation mask 63 is formed without the positions of the openings 63a for formation regions (not depicted) of the p-type regions 24 being shifted. Further, regarding the p-type regions 34 that are closest to the chip end (the edge termination region 20) in the intermediate region 30, the ion implantation mask 63 is formed without the positions of the openings 63a for the formation regions (not depicted) of the p-type regions 34 being shifted. Widths of the openings 63a in the edge termination region 20 are narrower than widths of the openings 63a in the active region 10 and the intermediate region 30.

Next, the second ion implantation 64 of ion implanting a p-type impurity such as boron (B) is performed using the ion implantation mask 63 as a mask (step S4). By the second ion implantation 64, p-type impurity implanted regions 4a are selectively formed in surface regions of the n⁻-type epitaxial layer 43a, at a predetermined repeat pitch in the active region 10, the edge termination region 20, and the intermediate region 30, respectively. The p-type impurity implanted regions 4a are formed so that parts thereof overlap the n-type impurity implanted regions 3a by the predetermined shifting amount d described above.

As a result, in surface regions of the n⁻-type epitaxial layer 43a, parts where the n-type impurity implanted regions 3a and the p-type impurity implanted regions 4a overlap each other, and parts where the n-type impurity implanted regions 3a and the p-type impurity implanted regions 4a are separate from each other are formed. In FIG. 8, the p-type impurity implanted regions 4a are indicated by dashed lines that are thicker than those of the n-type impurity implanted regions 3a (similarly regarding p-type impurity implanted regions in FIGS. 9 to 11). Subsequently, the ion implantation mask 63 is removed. Processes at step S3 and processes at step S4 may be interchanged.

Here, a configuration where, of the epitaxial layers 43a to 43e of the type deposited in multiple stages and becoming the first to the third parallel pn layers 5, 25, 35, only a portion of the p-type regions 34 and the p-type regions 4 formed in the n⁻-type epitaxial layer 43a of the first stage are shifted in the column shifting direction C by the predetermined shifting amount d has been described as an example. In a case where, in the second and subsequent type epitaxial layers, a portion of the p-type regions 34 and the p-type regions 4 are formed shifted in the column shifting direction C by the predetermined shifting amount d (a second embodiment, refer to FIG. 16), a process including steps S2 to S4 as one set is repeatedly performed a number of times corresponding to the number of stages.

Figure 9:
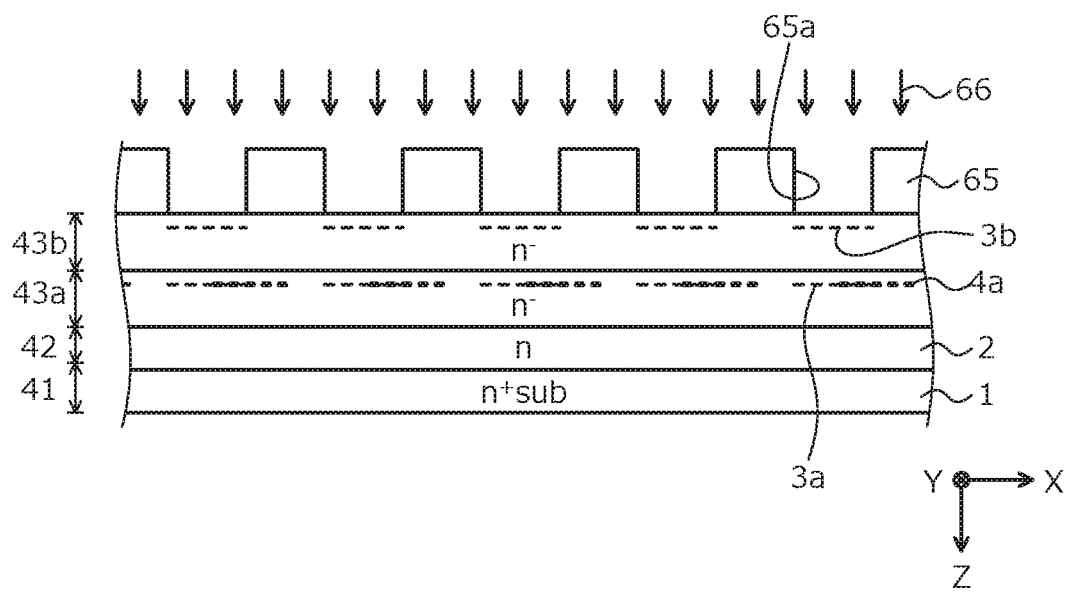
FIG. 9 is a cross-sectional view depicting a state of the semiconductor device according to the first embodiment during manufacture.

Next, as depicted in FIG. 9, the n⁻-type epitaxial layer 43b of the second stage is deposited on the n⁻-type epitaxial layer 43a by epitaxial growth to have a predetermined thickness, as a part of the epitaxial layer 43 configuring the first to the third parallel pn layers 5, 25, 35 (step S5). Next, on the n⁻-type epitaxial layer 43b, an ion implantation mask 65 is formed by a mask pattern similar to that of the ion implantation mask 61 used at step S3. Reference character 65a is openings of the ion implantation mask 65.

Next, a third ion implantation 66 of ion implanting an n-type impurity such as, for example, phosphorus is performed using the ion implantation mask 65 as a mask (step S6). By the third ion implantation 66, in surface regions of the n⁻-type epitaxial layer 43b, n-type impurity implanted regions 3b are selectively formed at positions respectively facing, in the depth direction Z, the n-type impurity implanted regions 3a in the n⁻-type epitaxial layer 43a below. Subsequently, the ion implantation mask 65 is removed.

Figure 10:
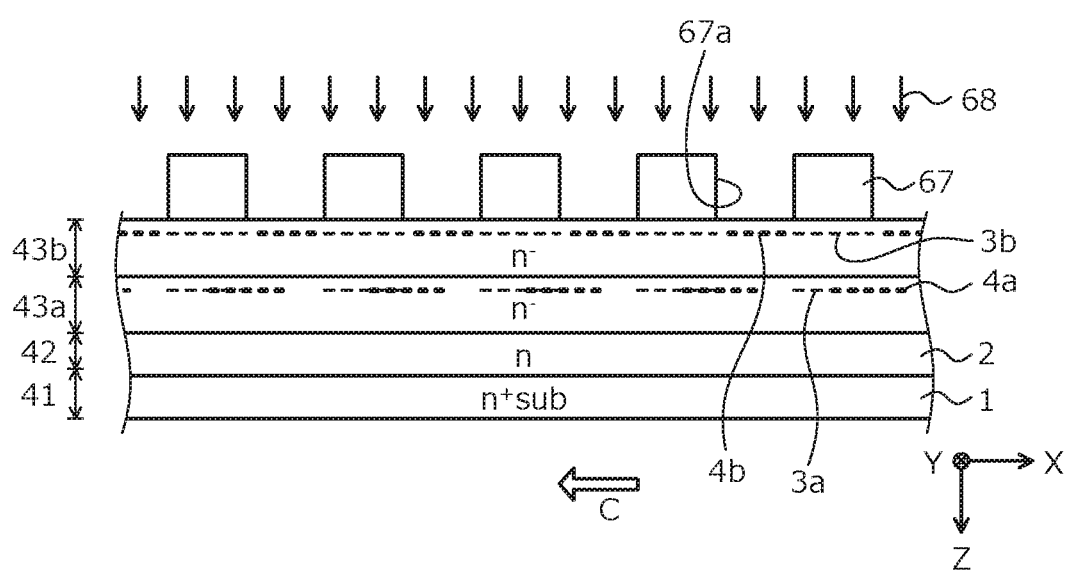
FIG. 10 is a cross-sectional view depicting a state of the semiconductor device according to the first embodiment during manufacture.

Next, as depicted in FIG. 10, on the n⁻-type epitaxial layer 43b, the ion implantation mask 67 opened at parts corresponding to formation regions of the p-type regions 4 of the first parallel pn layer 5, formation regions (not depicted) of the p-type regions 24 of the second parallel pn layers 25, and formation regions (not depicted) of the p-type regions 34 of the third parallel pn layers 35 is formed. Openings 67a of the ion implantation mask 67 are not shifted in the column shifting direction C. In the openings 67a of the ion implantation mask 67, the n⁻-type epitaxial layer 43b between adjacent n-type impurity implanted regions 3b is exposed.

Next, the fourth ion implantation 68 of ion implanting a p-type impurity such as boron is performed using the ion implantation mask 67 as a mask (step S7). By the fourth ion implantation 68, in the active region 10, the edge termination region 20, and the intermediate region 30, p-type impurity implanted regions 4b are selectively formed in surface regions of the n⁻-type epitaxial layer 43b, at a predetermined repeat pitch. The p-type impurity implanted regions 4b are formed between adjacent n-type impurity implanted regions 3b and do not overlap the n-type impurity implanted regions 3b. Processes at step S6 and processes at step S7 may be interchanged.

Next, as depicted in FIG. 11, on the n⁻-type epitaxial layer 43b, the n⁻-type epitaxial layers 43c to 43f are further deposited by epitaxial growth in multiple stages (for example, three stages), thereby forming the epitaxial layer 43 having a predetermined thickness and configured by the n⁻-type epitaxial layers 43a to 43f. Here, in the n⁻-type epitaxial layers 43c to 43e that are parts of the epitaxial layer 43 configuring the first to the third parallel pn layers 5, 25, 35, a process including steps S5 to S7 as one set is repeatedly performed for each deposition of the n⁻-type epitaxial layers 43c to 43e. In FIG. 6, repetition of the process including steps S5 to S7 as one set is indicated by an arrow from step S7 to step S5.

As a result, in the epitaxial layers 43c to 43e of the n⁻-type, n-type impurity implanted regions 3c to 3e are respectively formed at positions overlapping in the depth direction Z (same positions as) the n-type impurity implanted regions 3b of the epitaxial layer 43b of the n⁻-type of the second stage, so as to overlap in the depth direction Z. In the n⁻-type epitaxial layers 43c to 43e, p-type impurity implanted regions 4c to 4e are respectively formed at positions so as to overlap in the depth direction Z (same positions as) the p-type impurity implanted regions 4b in the n⁻-type epitaxial layer 43b of the second stage.

In the n⁻-type epitaxial layer 43f of the uppermost stage among the n⁻-type epitaxial layers 43a to 43f forming the epitaxial layer 43, the third and the fourth ion implantations 66, 68 need not be performed. Alternatively, configuration may be such that the third and the fourth ion implantations 66, 68 are performed in a part (for example, the edge termination region 20), whereby the parallel pn layers reach the front surface of the semiconductor substrate 40. By the processes up to here, the semiconductor substrate (semiconductor wafer) 40 in which the epitaxial layers 42, 43 are sequentially deposited on the front surface of the n⁺-type substrate 41 that becomes the n⁺-type drain region 1 is formed.

Next, as depicted in FIG. 12, impurities in the n⁻-type epitaxial layers 43a to 43e are diffused by a heat treatment (step S8). The n-type impurity implanted regions 3a to 3e and the p-type impurity implanted regions 4a to 4e each diffuses in a substantially cylinder-shape having a central axis at an ion implantation part of a substantially linear shape parallel to the second direction Y. As a result, the n-type impurity implanted regions 3a to 3e are connected to each other in the depth direction Z, thereby forming the n-type regions 3, 23, 33; and the p-type impurity implanted regions 4a to 4e are connected to each other in the depth direction Z, thereby forming the p-type regions 4, 24, 34.

After the processes at step S8, in the n⁻-type epitaxial layer 43a of the first stage, parts 73 having wide overlap width w3 between the n-type impurity implanted regions 3a and the p-type impurity implanted regions 4a and parts 74 having a narrow overlap width w4 therebetween are formed (FIG. 15). A reason for this is that at the processes at step S4, the p-type impurity implanted regions 4a are formed at positions that are shifted by the predetermined shifting amount d. As a result, the n-type regions 3 and the p-type regions 4 are formed having impurity concentration gradients that are asymmetrical along the first direction X (refer to FIG. 5). The p-type impurity implanted regions 4a may be diffused in the n-type buffer region 2.

Further, after the processes at step S8, in the n⁻-type epitaxial layers 43b to 43e of the second to the fifth stages, overlap widths w1, w2 of parts 71, 72 where due to thermal diffusion, the p-type impurity implanted regions 4b to 4e overlap the n-type impurity implanted regions 3b to 3e on both sides thereof along the first direction X are all equal (FIG. 14). A reason for this is that at the processes at steps S6, S7, the n-type impurity implanted regions 3b to 3e and the p-type impurity implanted regions 4b to 4e are formed so as to not overlap each other. As a result, the n-type regions 3 and the p-type regions 4 having impurity concentration gradients that are symmetrical along the first direction X are formed (refer to FIG. 4).

Further, at the processes at steps S3, S4, S6, and S7, between ends of the semiconductor substrate 40 and the second parallel pn layers 25, the first to the fourth ion implantations 62, 64, 66, 68 are not performed, thereby leaving parts thereof that become the n⁻-type drift regions 43' having the same impurity concentrations as at the time of deposition of the n⁻-type epitaxial layer 43. Further, during the processes at step S4, the p-type regions 34 (34a, 34b) disposed closest to the chip center along the first direction X in the third parallel pn layers 35 are also formed shifted in the column shifting direction C by the same shifting amount d as that of the p-type regions 4 of the first parallel pn layer 5.

Figure 13:
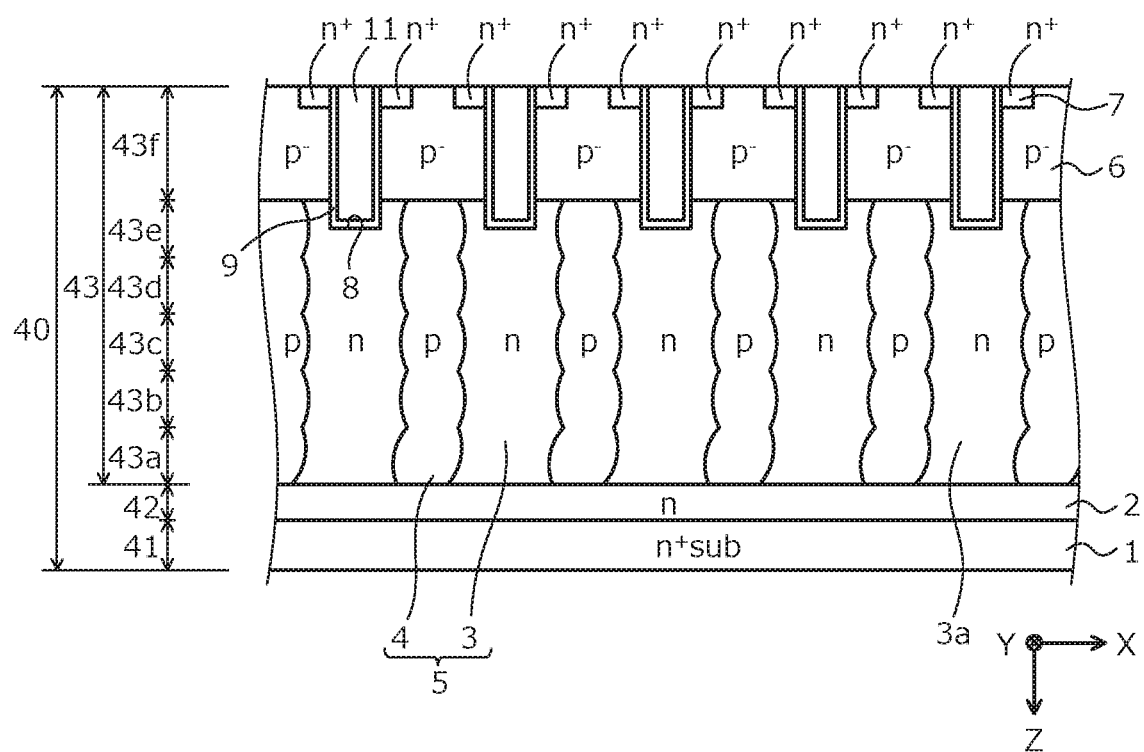
FIG. 13 is a cross-sectional view depicting a state of the semiconductor device according to the first embodiment during manufacture.

Next, as depicted in FIG. 13, by a general method, in the active region 10, in the n⁻-type epitaxial layer 43f, front-surface element structures such as the MOS gates (insulated gate structures) formed by the p⁻-type base region 6, the n⁺-type source regions 7, the trenches 8, the gate insulating film 9, and the gate electrodes 11, and the source electrode 13 are formed (step S9). Further, at the process at step S9, the p⁻⁻-type RESURF region 21, the p⁻-type channel stopper region 22, the LOCOS film 26, the gate polysilicon layer 27, the channel stopper electrode 28, and the gate metal layer 29, etc. are formed.

Here, the gate polysilicon layer 27, for example, is formed concurrently with the gate electrodes 11 by leaving a part of a polysilicon layer that is deposited on the front surface of the semiconductor substrate 40 to thereby form the gate electrodes 11. The p⁻-type base region 6 is formed, for example, after formation of the gate electrodes 11 and the gate polysilicon layer 27, by ion implantation that uses the gate electrodes 11 and the gate polysilicon layer 27 as an ion implantation mask. The p⁻-type channel stopper region 22 may be formed concurrently by the same ion implantation for the p⁻-type base region 6.

The source electrode 13, the channel stopper electrode 28, and the gate metal layer 29 are formed concurrently by patterning a single metal film (or stacked metal film) deposited on the front surface of the semiconductor substrate 40 into a predetermined pattern. Next, by a general method, back-surface element structures such as the drain electrode 14 are formed at the back surface of the semiconductor substrate 40 (step S10). Thereafter, the semiconductor substrate (semiconductor wafer) 40 is diced (cut) into individual chips, whereby the super junction MOSFET depicted in FIGS. 1 to 5 is completed.

As described above, according to the first embodiment, in the active region, the n-type regions and the p-type regions of the first parallel pn layer are configured having, at parts toward the source, impurity concentration gradients that, with respect to the peak positions of the impurity concentrations, are symmetrical toward both sides along the first direction, while having at parts toward the drain, impurity concentration gradients that, with respect to the peak positions, are asymmetrical toward both sides along the first direction. In the n-type regions and the p-type regions of the first parallel pn layer, positions of the parts toward the drain are shifted in the first direction by the predetermined shifting amount, whereby the impurity concentrations and mathematical areas (widths) are not changed and thus, charge balance does not collapse.

Therefore, decreases in breakdown voltage BVdss may be suppressed without the charge balance of the n-type regions and the p-type regions of the first parallel pn layer collapsing. Further, conventionally, a condition that a p/n ratio has high avalanche resistance and is p-rich was used while a condition described hereinafter that a p/n ratio that is 1 and rapidly decreases the avalanche resistance was avoided; however, even when the condition that the p/n ratio is 1 is used, rapid decreases in avalanche resistance do not occur. As a result, a condition of a p/n ratio that does not collapse the charge balance may be used, thereby enabling the ON resistance to be reduced.

In addition, in the n-type regions and the p-type regions of the first parallel pn layer, the positions of the parts thereof toward the drain are shifted in the first direction by the predetermined shifting amount, thereby enabling the first parallel pn layer to be formed having parts that are toward the drain and where the impurity concentration gradients partially become steep and enabling places where avalanche breakdown occurs to be guided toward the drain side of first parallel pn layer, whereby breakdown voltage decreases may be suppressed. Further, at the p⁻-type base region that is the base of the npn parasitic bipolar transistor formed by the n⁺-type source regions, the p⁻-type base region, and the n-type buffer region, flow of avalanche current is possible through the resistance component (drift resistance) of the p-type regions of the first parallel pn layer, thereby enabling decreases in the avalanche resistance to be suppressed.

Figure 16:
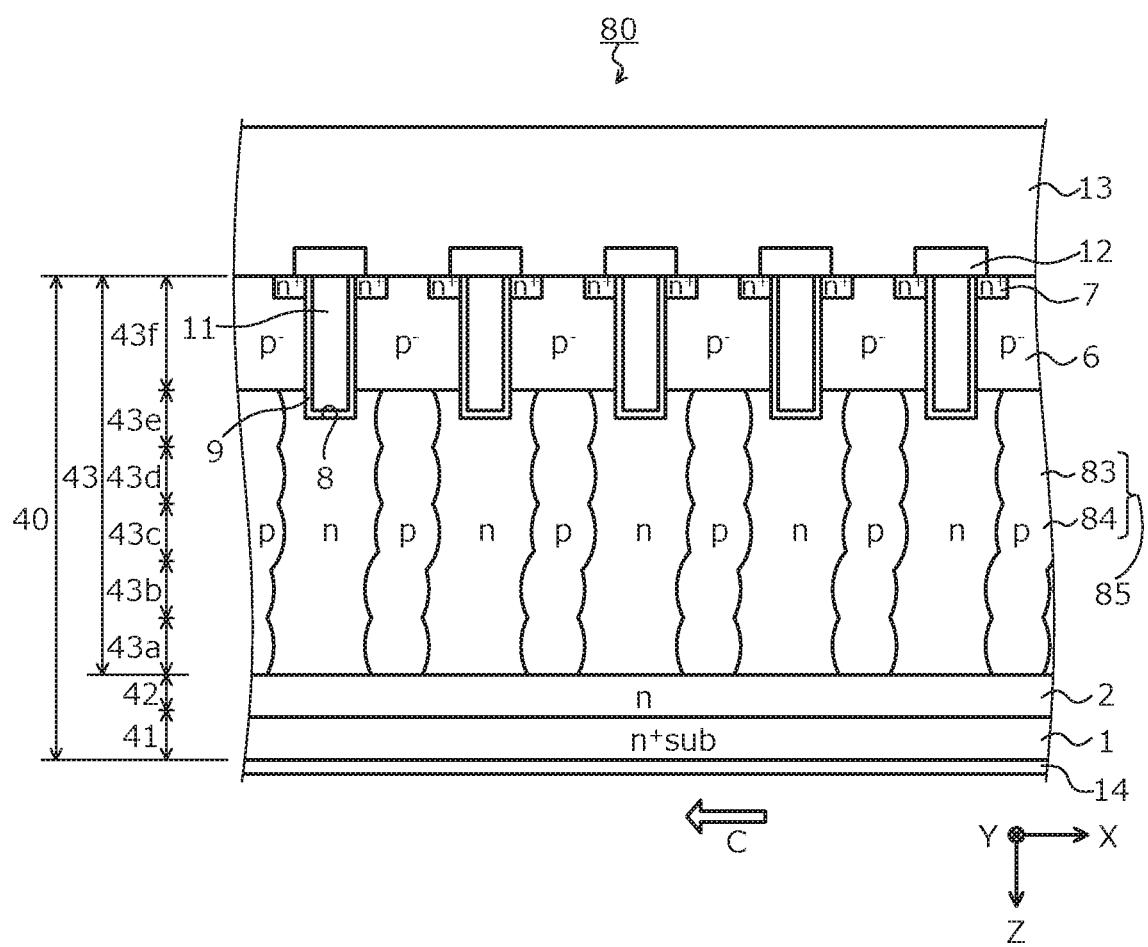
FIG. 16 is a cross-sectional view of a structure of a semiconductor device according to a second embodiment.

A structure of a semiconductor device according to a second embodiment will be described. FIG. 16 is a cross-sectional view of a structure of the semiconductor device according to the second embodiment. A layout of a semiconductor device 80 according to the second embodiment when viewed from the front surface of the semiconductor substrate 40 is similar to that of the semiconductor device 50 according to the first embodiment (refer to FIG. 1).

The semiconductor device 80 according to the second embodiment differs from the semiconductor device 50 according to the first embodiment in that the n-type regions 3 and the p-type regions 4 of the n⁻-type epitaxial layers of the second and subsequent stages are configured to have impurity concentration gradients that are asymmetrical along the first direction X. FIG. 16 depicts a case in which, of the n⁻-type epitaxial layers 43a to 43e deposited in multiple stages and configuring the first to the third parallel pn layers 5, 25, 35, the n-type regions 3 and the p-type regions 4, 34 of the n⁻-type epitaxial layers 43a, 43b of the first and the second stages are configured to have impurity concentration gradients that are asymmetrical along the first direction X.

Similarly to the second embodiment, when the n-type regions 3 and the p-type regions 4, 34 are formed in the n⁻-type epitaxial layers of multiple stages to have impurity concentration gradients that are asymmetrical along the first direction X, the n-type regions 3 and the p-type regions 4, 34 having impurity concentration gradients that are asymmetrical along the first direction X are formed in the n⁻-type epitaxial layer 43a of the first stage and the n⁻-type epitaxial layers of multiple stages continuous and adjacent to the n⁻-type epitaxial layer 43a in the depth direction Z. Here, in the n⁻-type epitaxial layers of all these stages, the shifting amount d and the column shifting direction C are the same in each.

A method of manufacturing the semiconductor device 80 according to the second embodiment, includes in the method of manufacturing the semiconductor device 50 according to the first embodiment as described above, repeatedly performing the processes at steps S2 to S4 (refer to FIG. 6) as one set, a number of times corresponding to the number of stages of the n⁻-type epitaxial layers in which the n-type regions 3 and the p-type regions 4, 34 are formed having impurity concentration gradients that are asymmetrical along the first direction X.

As described above, according to the second embodiment, even when the n-type regions and the p-type regions of the first parallel pn layer, each having a impurity concentration gradient that is asymmetrical along the first direction, are formed spanning the n⁻-type epitaxial layers of multiple stages, effects similar to those of the first embodiment may be obtained.

Figure 17:
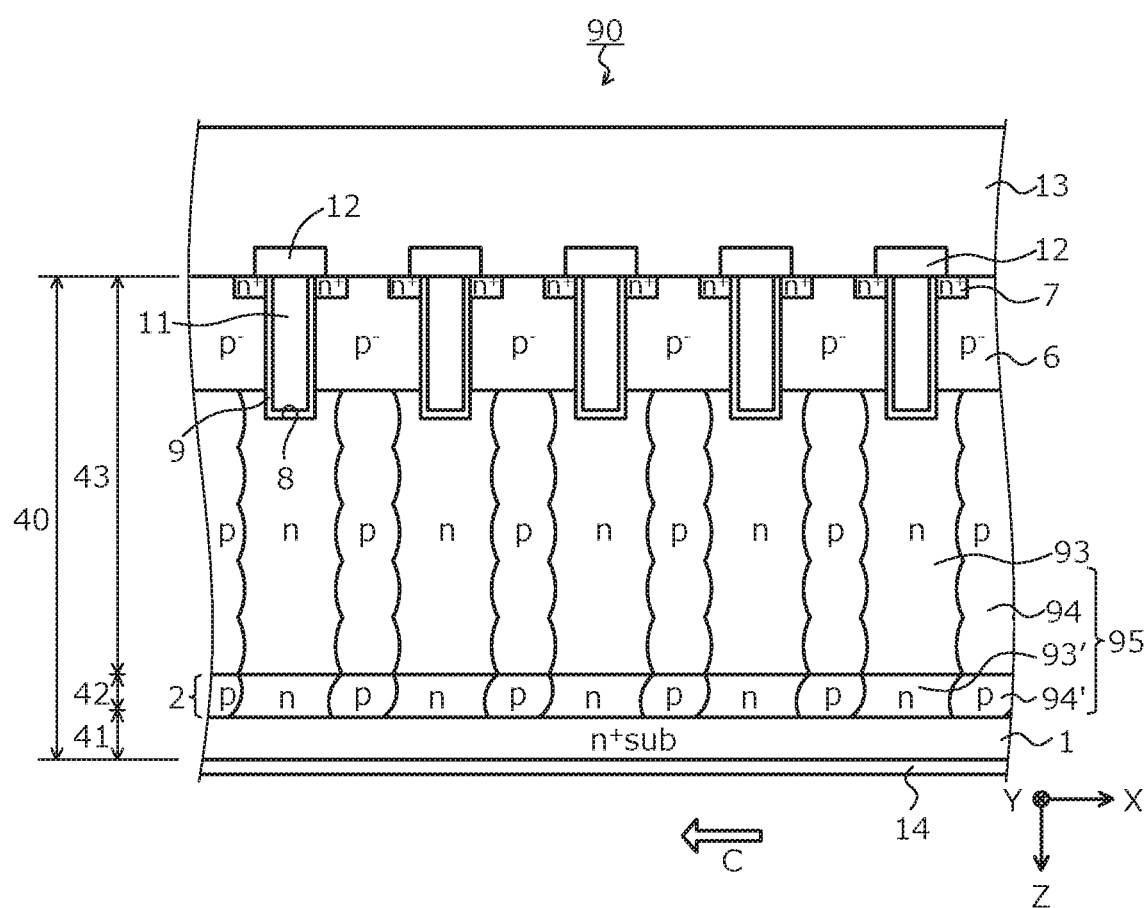
FIG. 17 is a cross-sectional view of a structure of a semiconductor device according to a third embodiment.

A structure of a semiconductor device according to a third embodiment will be described. FIG. 17 is a cross-sectional view of the structure of the semiconductor device according to the third embodiment. A layout when a semiconductor device 90 according to the third embodiment is viewed from the front surface of the semiconductor substrate 40 is similar to that of the semiconductor device 50 according to the first embodiment (refer to FIG. 1).

The semiconductor device 90 according to the third embodiment differs from the semiconductor device 50 according to the first embodiment in that the n-type epitaxial layer 42 that becomes the n-type buffer region 2 is an epitaxial layer of the first stage and in which n-type regions 93' and p-type regions 94' of a first parallel pn layer 95 have impurity concentration gradients that are asymmetrical along the first direction X are formed.

In FIG. 17, while configuration is such that in the epitaxial layer 43, n-type regions 93 and p-type regions 94 having impurity concentration gradients that are symmetrical along the first direction X are formed, further, in the n⁻-type epitaxial layer 43a of the first stage of the epitaxial layer 43, the n-type regions 93 and the p-type regions 94 having impurity concentration gradients that are asymmetrical along the first direction X may be formed.

A method of manufacturing the semiconductor device 90 according to the third embodiment includes in the method of manufacturing the semiconductor device 50 according to the first embodiment, performing the processes at steps S2 to S4 (refer to FIG. 6) as one set in the n-type epitaxial layer 42 that becomes the n-type buffer region 2, and forming the n-type regions 93' and the p-type regions 94' that have impurity concentration gradients that are asymmetrical along the first direction X.

While not particularly limited hereto, in the third embodiment, the n-type buffer region 2 (the n-type epitaxial layer 42) has a thickness of, for example, about 3.5 μm. Impurity concentrations of the n-type regions 93' and the p-type regions 94' of the first parallel pn layer 95 formed in the n-type epitaxial layer 42, for example, are in a range from 1.0E+16/cm³ to 4.0E+16/cm³.

As described above, according to the third embodiment, in the n-type epitaxial layer that becomes the n-type buffer region 2, even when the n-type regions and the p-type regions having impurity concentration gradients that are asymmetrical along the first direction are formed in the first parallel pn layer, effects similar to those of the first embodiment may be obtained.

Figure 18:
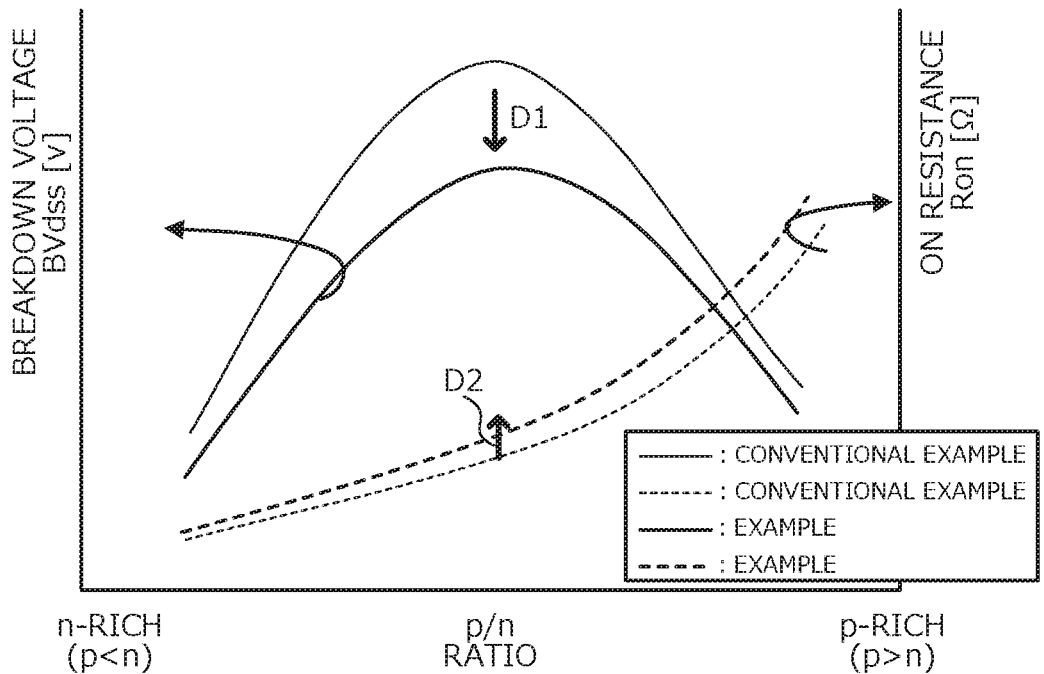
FIG. 18 is a characteristics diagram depicting a relationship between ON resistance Ron, breakdown voltage BVdss, and a p/n ratio of a first parallel pn layer of an example.
Figure 19:
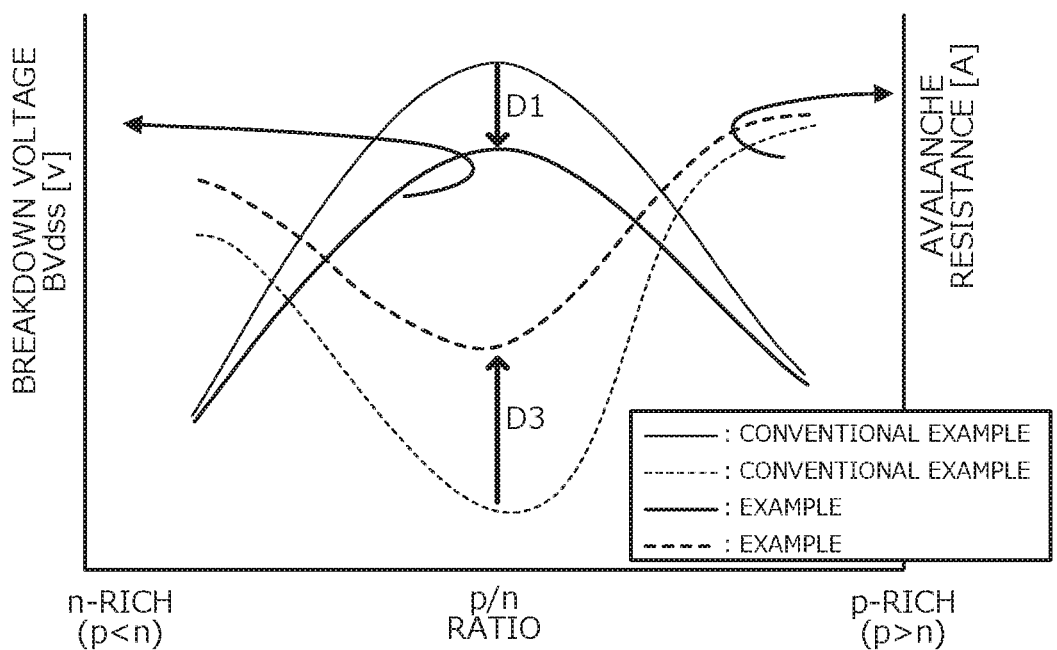
FIG. 19 is a characteristics diagram depicting a relationship between avalanche resistance, the breakdown voltage BVdss, and the p/n ratio of the first parallel pn layer of the example.

A relationship between a ratio (hereinafter, p/n ratio of the first parallel pn layer 5) of impurity amounts of the n-type regions 3 and the p-type regions 4 of the first parallel pn layer 5, the breakdown voltage BVdss, the ON resistance Ron, and the avalanche resistance was verified. FIG. 18 is a characteristics diagram depicting a relationship between the ON resistance Ron, the breakdown voltage BVdss, and the p/n ratio of the first parallel pn layer of an example. FIG. 19 is a characteristics diagram depicting a relationship between the avalanche resistance, the breakdown voltage BVdss, and the p/n ratio of the first parallel pn layer of the example.

In FIGS. 18 and 19, a horizontal axis indicates the p/n ratio of the first parallel pn layer 5. The p/n ratio of the first parallel pn layer 5 is a ratio of the impurity amount of the p-type regions 4 to the impurity amount of the n-type regions 3 of the first parallel pn layer 5. In FIGS. 18 and 19, the horizontal axis is for a case in which a center is where the impurity amount of the n-type regions 3 and the impurity amount of the p-type regions 4 of the first parallel pn layer 5 are equal (p=n, i.e., p/n ratio=1), and the impurity amount of the n-type regions 3 is greater with increasing proximity to a left side in the figure (n-rich, p<n) while the impurity amount of the p-type regions 4 is greater with increasing proximity to a right side in the figure (p-rich, p>n).

The p/n ratio of the first parallel pn layer 5 was variously changed in a super junction MOSFET (the example) having the configuration of the semiconductor device 50 according to the first embodiment described above and resulting measurements of the breakdown voltage BVdss and the ON resistance Ron thereof are depicted in FIG. 18. The p/n ratio of the first parallel pn layer 5 in the example was variously changed and resulting measurements of the breakdown voltage BVdss and avalanche resistance thereof are depicted in FIG. 19. In FIG. 19, results of the breakdown voltage BVdss for the example and a conventional example are a same as the results of the breakdown voltage BVdss in FIG. 18.

The example is configured by the epitaxial layers 43a to 43e of five stages configuring the first to the third parallel pn layers 5, 25, 35 and the n-type regions 3 and the p-type regions 4 having impurity concentration gradients that are asymmetrical along the first direction X are formed only in the n⁻-type epitaxial layer 43a of the first stage. The shifting amount d of the p-type regions 4 in the n⁻-type epitaxial layer 43a of the first stage was 15% of the repeat pitch of the n-type regions 3 and the p-type regions 4.

Figure 20:
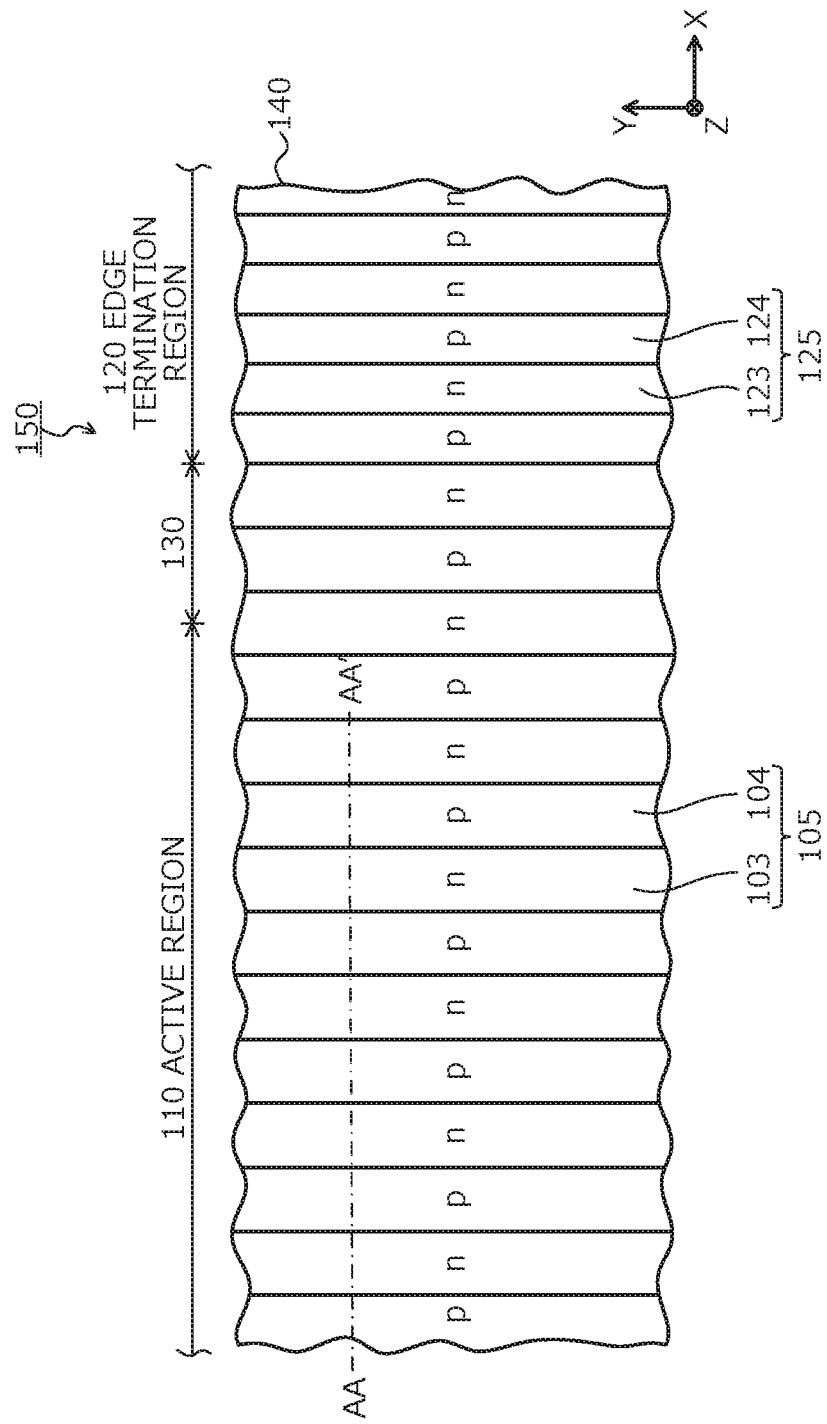
FIG. 20 is a plan view depicting a layout of a parallel pn layer of a conventional super junction semiconductor device as viewed from a front side of a semiconductor substrate.
Figure 21:
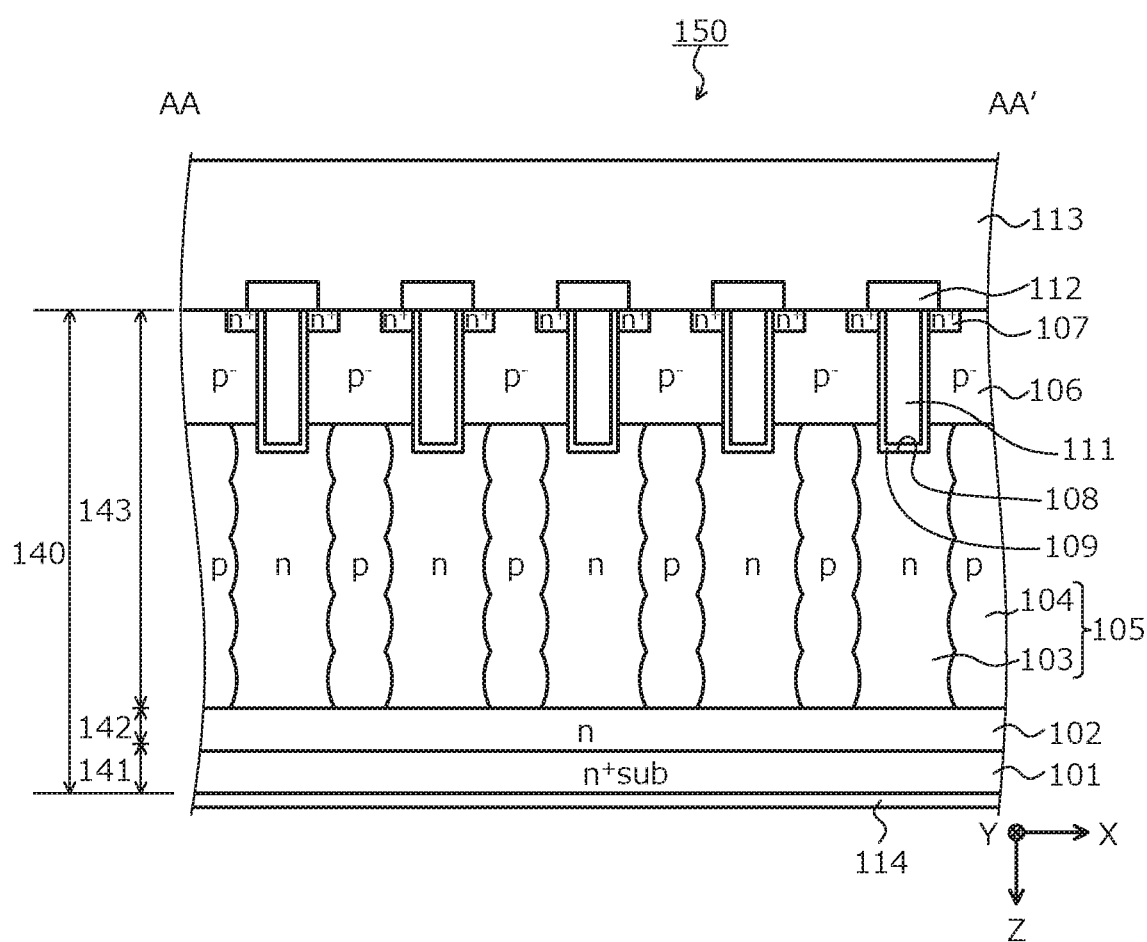
FIG. 21 is a cross-sectional view of a structure along cutting line AA-AA' in FIG. 20.

In FIGS. 18 and 19, for comparison, measurement results for the same properties as in the example are depicted for the conventional super junction semiconductor device 150 (FIG. 20, 21, hereinafter, conventional example) in which the n-type regions 103 and the p-type regions 104 having impurity concentration gradients that are symmetrical in the first direction are disposed in each of the epitaxial layers 143 for all the stages configuring the parallel pn layer 105. Configuration of the conventional example was a same as that of the example excluding the configuration of the parallel pn layer 105 of the active region in the conventional example.

From the results depicted in FIG. 18, it was confirmed that in the example in which the n-type regions 3 and the p-type regions 4 having impurity concentration gradients that are asymmetrical along the first direction X are disposed at a part of the first parallel pn layer 5, whereby when the impurity amount of the n-type regions 3 and the impurity amount of the p-type regions 4 in the first parallel pn layer 5 are equal (p/n ratio=1), the breakdown voltage BVdss decreased about 10% (arrow indicated by reference character D1) as compared to the conventional example, however, increase of the ON resistance Ron was suppressed to 5% or less (arrow indicated by reference character D2 in FIG. 18) and the avalanche resistance increased about 20% to 30% (arrow indicated by reference character D3 in FIG. 19).

In the conventional example, to avoid the problem described above that occurs when the charge balance between the n-type regions 103 and the p-type regions 104 of the parallel pn layer 105 is over compensated for, the impurity amount of the n-type regions 103 and the impurity amount of the p-type regions 104 of the parallel pn layer 105 are intentionally set to be unequal and the maximum breakdown voltage BVdss (the breakdown voltage BVdss when the p/n ratio=1 for the first parallel pn layer 105) that is actually obtainable is not used.

Therefore, it was confirmed that in the example, under the condition that the p/n ratio of the first parallel pn layer 5 is 1, even when the breakdown voltage BVdss decreases, a breakdown voltage BVdss is obtainable that is about a same as the breakdown voltage BVdss obtainable by the conditions of the conventional example and while the ON resistance slightly increases under the condition that the p/n ratio is 1, use of a p/n ratio in a range by which the ON resistance is low becomes possible, enabling the ON resistance Ron to be reduced to a greater extent than in the conventional example, and the avalanche resistance may be increased.

In the foregoing, without limitation to the embodiments described above, various modifications within a range not departing from the spirit of the present invention are possible. For example, in the active region, at an epitaxial layer of a stage where the n-type regions and the p-type regions having impurity concentration gradients that are asymmetrical along the first direction are formed, the shifting amount and the column shifting direction C of all the p-type regions suffice to be the same and a layout of the n-type regions and the p-type regions of the parallel pn layer when viewed from the front surface of the semiconductor substrate may be variously changed. For example, in the present invention, a parallel pn layer may be formed having p-type regions disposed in grid shape and an n-type region that surrounds peripheries of all the p-type regions as viewed from the front surface of the semiconductor substrate.

Further, in the present invention, in the active region, parts of the first parallel pn layer toward the drain suffice to be set as the n-type regions and the p-type regions having impurity concentration gradients that are asymmetrical along the first direction and the parallel pn layer may be formed using a trench embedding method of forming trenches in an epitaxial layer and embedding an epitaxial layer of a different conductivity type in the trenches. In this case, for example, by the multi-stage epitaxial method or the trench embedding method, the n-type regions and the p-type regions having the impurity concentration gradients that are asymmetrical along the first direction are formed in the epitaxial layer of the first stage. Thereafter, on the epitaxial layer of the first stage, in the epitaxial layer of the second stage deposited so that a total thickness of the semiconductor substrate is obtained, the parallel pn layer suffices to be formed by the trench embedding method.

Further, in the embodiments described above, on a single semiconductor substrate having a super junction MOSFET (second insulated gate field effect transistor) that is a main semiconductor element, a current sensing part (second insulated gate field effect transistor) may be disposed separate from the main semiconductor element. The current sensing part operates under same conditions as those of the main semiconductor element and has a function of detecting over current (OC) flowing in the main semiconductor element. The current sensing part is a super junction MOSFET that has unit cells of a same configuration as the configuration of the unit cells of the main semiconductor element, the current sensing part having fewer unit cells than does the main semiconductor element. The current sensing part may have a first parallel pn layer of a same configuration as that of the main semiconductor element.

Further, in the embodiments described above, while the p-type regions of the first parallel pn layer are disposed shifted in the column shifting direction C, thereby forming the n-type regions and the p-type regions that have impurity concentration gradients that are asymmetrical along the first direction, the n-type regions of the first parallel pn layer may be disposed shifted in the column shifting direction C, thereby forming the n-type regions and the p-type regions that have impurity concentration gradients that are asymmetrical along the first direction.

According to the present invention described above, in the first first-conductivity-type regions and the first second-conductivity-type regions of the first parallel pn layer, positions of parts thereof toward a second main surface are shifted along the first direction by the predetermined shifting amount, whereby the impurity concentrations and mathematical areas (widths) are not changed and thus, the charge balance does not collapse. Therefore, first first-conductivity-type regions and first second-conductivity-type regions of the first parallel pn layer may be charge balanced. Further, at portions of the first parallel pn layer toward the second main surface, parts where the impurity concentration gradient is partially steep may be formed and the occurrence of avalanche breakdown may be guided toward the second main surface of the first parallel pn layer. Further, at the base of a npn parasitic bipolar transistor formed in the semiconductor substrate, the flow of avalanche current through the resistance component (drift resistance) of the first second-conductivity-type regions of the first parallel pn layer is possible.

The semiconductor device according to the present invention achieves an effect in that suppression of decreases in the breakdown voltage of a super junction semiconductor device that has a parallel pn layer as a drift layer, suppression of decreases in avalanche resistance, and reduction of the ON resistance may be facilitated.

As described above, the semiconductor device according to the present invention is useful for super junction semiconductor devices that are used in power converting equipment and in power source devices such as those of industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
a semiconductor substrate of a first conductivity type, the semiconductor substrate having an upper surface;
a first parallel pn layer having a plurality of first first-conductivity-type regions and a plurality of first second-conductivity-type regions disposed repeatedly alternating one another along a first direction that is parallel to the upper surface of the semiconductor substrate, the first parallel pn layer being provided at the upper surface of the semiconductor substrate and having an upper surface; and
an insulated gate structure provided at the upper surface of the first parallel pn layer, wherein
each of the plurality of first first-conductivity-type regions has, along the first direction, a first impurity concentration that has a maximum value thereof at a first peak position and that decreases gradually from the first peak position, said each of the plurality of first first-conductivity-type regions having, along a depth direction thereof, a first part that reaches a predetermined depth from the upper surface of the first parallel pn layer, and a second part that is closer to the semiconductor substrate than is the first part, a gradient of the first impurity concentration along the first direction being respectively symmetrical and asymmetrical in the first part and in the second part, with respect to the first peak position, and
each of the plurality of first second-conductivity-type regions has, along the first direction, a second impurity concentration that has a maximum value thereof at a second peak position and that decreases gradually from the second peak position, said each of the plurality of first second-conductivity-type regions including, along a depth direction thereof, a third part that reaches the predetermined depth from the upper surface of the first parallel pn layer, and a fourth part that is closer to the semiconductor substrate than is the third part, a gradient of the second impurity concentration along the first direction being respectively symmetrical and asymmetrical in the third part and in the fourth part, with respect to the second peak position.

2. The semiconductor device according to claim 1, wherein
the first impurity concentration of each of the plurality of first first-conductivity-type regions has different first peak positions in the first part and in the second part along the first direction, the different first peak positions being respectively centered and off-centered with respect to the first part and the second part along the first direction,
the second impurity concentration of each of the plurality of first second-conductivity-type regions has different second peak positions in the third part and in the fourth part along the first direction, the different second peak positions being respectively centered and off-centered with respect to the third part and the fourth part along the first direction.

3. The semiconductor device according to claim 1, wherein
the plurality of first first-conductivity-type regions and the plurality of first second-conductivity-type regions are disposed repeatedly with a repeat pitch, and
a distance between the first peak position of the first part and the first peak position of the second part along the first direction is in a range from 7% to 18% of the repeat pitch.

4. The semiconductor device according to claim 1, wherein
the first impurity concentration of each of the plurality of first first-conductivity-type regions has different first peak positions in the first part and in the second part thereof along the first direction,
the second impurity concentration of each of the plurality of first second-conductivity-type regions has different second peak positions in the third part and in the fourth part along the first direction,
all first peak positions of the second parts of all of the plurality of first first-conductivity-type regions are off-centered in a same direction along the first direction with respect to the respective second parts, and
all second peak positions of the fourth parts of all of the plurality of first second-conductivity-type regions are off-centered in the same direction along the first direction with respect to the respective fourth parts.

5. The semiconductor device according to claim 1, wherein
the plurality of first first-conductivity-type regions and the plurality of first second-conductivity-type regions are disposed repeatedly alternating one another at a first repeat pitch; and
the semiconductor device further comprises:
a second parallel pn layer having a plurality of second first-conductivity-type regions and a plurality of second second-conductivity-type regions disposed repeatedly alternating one another along the first direction at a second repeat pitch that is smaller than the first repeat pitch, the second parallel pn layer surrounding a periphery of the first parallel pn layer, wherein
each of the plurality of second first-conductivity-type regions has a third impurity concentration that has a maximum value thereof at a third peak position and that decreases gradually from the third peak position along the first direction, a gradient of the third impurity concentration along the first direction being symmetrical along the first direction with respect to the third peak position, and
each of the plurality of second second-conductivity-type regions has a fourth impurity concentration that has a maximum value thereof at a fourth peak position and that decreases gradually from the fourth peak position along the first direction, a gradient of the fourth impurity concentration along the first direction being symmetrical along the first direction with respect to the fourth peak position.

6. The semiconductor device according to claim 5, further comprising
a third parallel pn layer having a plurality of third first-conductivity-type regions and a plurality of third second-conductivity-type regions disposed repeatedly alternating one another along the first direction at a third repeat pitch that is equal to the first repeat pitch, the third parallel pn layer being disposed between the first parallel pn layer and the second parallel pn layer, and surrounding a periphery of the first parallel pn layer, wherein the plurality of third second-conductivity-type regions has an impurity concentration distribution that is the same as an impurity concentration distribution of the plurality of first second-conductivity-type regions, and only an innermost third second-conductivity-type region, of the plurality of third second-conductivity-type regions, that is disposed closest to a chip center has an impurity concentration of which a gradient is the same as the gradient of the second impurity concentration of each of the plurality of first second-conductivity-type regions.

7. The semiconductor device according to claim 1, further comprising a semiconductor layer of the first conductivity type, provided between the semiconductor substrate and the first parallel pn layer.

8. The semiconductor device according to claim 1, further comprising:

a first insulated gate field effect transistor having the insulated gate structure and the first parallel pn layer provided on the semiconductor substrate, the first insulated gate field effect transistor including a first number of unit cells; and a second insulated gate field effect transistor provided on the semiconductor substrate and having a plurality of unit cells fewer in number than the first number of unit cells of the first insulated gate field effect transistor, each of the plurality of unit cells of the second insulated gate field effect transistor having a structure that is the same as a structure of the unit cells of the first insulated gate field effect transistor.

* * * * *